US006199874B1

(12) United States Patent
Galvin et al.

(10) Patent No.: US 6,199,874 B1
(45) Date of Patent: *Mar. 13, 2001

(54) MICROELECTROMECHANICAL ACCELEROMETER FOR AUTOMOTIVE APPLICATIONS

(75) Inventors: Gregory J. Galvin, Ithaca; Timothy J. Davis, Trumansburg; Noel C. MacDonald, Ithaca, all of NY (US)

(73) Assignees: Cornell Research Foundation Inc.; Kionix, Inc., both of Ithaca, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/568,845

(22) Filed: Dec. 7, 1995

Related U.S. Application Data

(63) Continuation-in-part of application No. 08/246,265, filed on May 19, 1994, now Pat. No. 5,563,343, which is a continuation-in-part of application No. 08/067,264, filed on May 26, 1993, now Pat. No. 5,610,335.

(51) Int. Cl.$^7$ ................................................. B60G 17/00
(52) U.S. Cl. ..................................... 280/5.514; 280/6.157
(58) Field of Search ........................... 73/514.18, 514.24, 73/514.36, 514.38, 504.16; 361/280; 438/718, 719; 280/5.5, 5.514, 5.515, 5.519, 5.507, 5.508, 6.157

(56) References Cited

U.S. PATENT DOCUMENTS 3,498,138  3/1970  Stewart ............................. 73/514.23
4,342,227  8/1982  Petersen et al. ........................ 73/510
4,426,246  *  1/1984  Kravitz ................................. 438/719
4,483,194  11/1984  Rudolf ................................. 73/517 R (List continued on next page.)

OTHER PUBLICATIONS

Wolf D. Frobenius, et al., "Microminiature Ganged Threshold Accelerometers Compatible With Integrated Circuit Technology," *IEEE Trans. Electron Devices*, vol. ED–19, No. 1, (1972), pp. 37–40, (no month).

(List continued on next page.)

*Primary Examiner*—Helen C. Kwok
(74) *Attorney, Agent, or Firm*—Jones, Tullar & Cooper, P.C.

(57) ABSTRACT

A micromechanical capacitive accelerometer is provided from a single silicon wafer. The basic structure of the micromechanical accelerometer is etched in the wafer to form a released portion in the substrate, and the released and remaining portions of the substrate are coated with metal under conditions sufficient to form a micromechanical capacitive accelerometer. The substrate is preferably etched using reactive-ion etching for at least the first etch step in the process that forms the basic structure, although in another preferred embodiment, all etching is reactive-ion etching. The accelerometer also may comprise a signal-conditioned accelerometer wherein signal-conditioning circuitry is provided on the same wafer from which the accelerometer is formed, and VLSI electronics may be integrated on the same wafer from which the accelerometer is formed. The micromechanical capacitive accelerometer can be used for airbag deployment, active suspension control, active steering control, anti-lock braking, and other control systems requiring accelerometers having high sensitivity, extreme accuracy and resistance to out of plane forces.

6 Claims, 10 Drawing Sheets

U.S. PATENT DOCUMENTS

| | | | |
|---|---|---|---|
| 4,553,436 | 11/1985 | Hansson | 73/517 R |
| 4,625,993 | 12/1986 | Williams et al. | 280/707 |
| 4,640,737 * | 2/1987 | Nagasaka | 438/718 |
| 4,653,326 | 3/1987 | Danel et al. | 73/517 R |
| 4,662,059 * | 5/1987 | Smeltzer | 438/719 |
| 4,663,972 | 5/1987 | Gerard | 73/517 R |
| 4,696,489 * | 9/1987 | Fujishiro et al. | 280/5.515 |
| 4,711,128 | 12/1987 | Boura | 73/517 B |
| 4,736,629 | 4/1988 | Cole | 73/517 R |
| 4,772,928 | 9/1988 | Dietrich et al. | 357/26 |
| 4,830,397 * | 5/1989 | Watanabe et al. | 280/5.515 |
| 4,882,933 | 11/1989 | Petersen et al. | 73/517 R |
| 4,945,765 | 8/1990 | Roszhart | 73/517 AV |
| 5,095,752 | 3/1992 | Suzuki et al. | 73/517 R |
| 5,098,122 | 3/1992 | Breed et al. | 280/735 |
| 5,103,667 | 4/1992 | Allen et al. | 73/1 D |
| 5,121,180 | 6/1992 | Beringhause et al. | 357/26 |
| 5,126,812 | 6/1992 | Greiff | 357/25 |
| 5,198,390 | 3/1993 | MacDonald et al. | 437/203 |
| 5,205,171 | 4/1993 | O'Brien et al. | 73/517 B |
| 5,233,213 * | 8/1993 | Marek | 73/514.02 |
| 5,249,465 | 10/1993 | Bennett et al. | 73/510 |
| 5,253,510 | 10/1993 | Allen et al. | 73/1 D |
| 5,255,191 * | 10/1993 | Fulks | 280/5.515 |
| 5,260,596 | 11/1993 | Dunn et al. | 257/414 |
| 5,275,474 | 1/1994 | Chin et al. | 303/94 |
| 5,295,074 | 3/1994 | Williams | 364/424.05 |
| 5,314,572 | 5/1994 | Core et al. | 156/643 |
| 5,315,518 | 5/1994 | Lin | 364/426.02 |
| 5,316,979 | 5/1994 | MacDonald et al. | 437/203 |
| 5,345,824 | 9/1994 | Sherman et al. | 73/517 B |
| 5,348,111 | 9/1994 | Williams et al. | 180/140 |
| 5,349,855 * | 9/1994 | Bernstein | 73/504.16 |
| 5,353,641 | 10/1994 | Tang | 73/517 R |
| 5,357,803 | 10/1994 | Lane | 73/517 B |
| 5,393,375 | 2/1995 | MacDonald et al. | 156/643 |
| 5,411,289 | 5/1995 | Smith et al. | 280/735 |
| 5,436,838 | 7/1995 | Miyamori | 364/424.05 |
| 5,454,630 | 10/1995 | Zhang | 303/175 |
| 5,490,067 | 2/1996 | Teguri et al. | 364/424.05 |
| 5,828,970 * | 10/1998 | Kimura et al. | 280/5.515 |

OTHER PUBLICATIONS

G.A. MacDonald, "A Review of Low Cost Accelerometers for Vehicle Dynamics," *Sensors and Actuators,* A21–A23 (1990), pp. 303–307. (No month).

Robert E. Sulouff, Jr., "Silicon sensors For Automotive Applications," Proc. 6$^{th}$ Int. Conf. Solid–State Sensors and Actuators (Transducers '91), San Francisco, CA, Jun. 24–28, pp., 170–176.

Ernest O. Doebelin, *Measurement Systems: Applications and Design,* (McGraw–Hill, New York, 1990), 4$^{th}$ edition, pp. 319–322, (no month).

Janusz Bryzek, et. al., "Micromachines on the March," *IEEE Spectrum,* May 1994, pp. 20–31.

Leo O'Connor, "MEMS: Micromechanical Systems," Mechanical Engineering, Feb. 1992, pp. 40–47.

Theresa A. Core, et al., "Fabrication Technology for an Integrated Surface–Micromachined Sensor," *Solid State Technology,* Oct. 1993, pp. 39–47.

Wolfgang Kuehnel and Steven Sherman, "A surface micromachined silicon accelerometer with on–chip detection circuitry," *Sensors and Actuators A* 45 (1994), pp. 7–16, (no month).

Frank Goodenough, "Airbags Boom When IC Accelerometer Sees 50g," *Electronic Design,* Aug. 8, 1991, pp. 45–56.

Lynn Michele Roylance and James B. Angell, "A Batch–Fabricated Silicon Accelerometer," *IEEE Trans. Electron Dev.* vol. ED–26, No. 12, (Dec. 1979), pp. 1911–1917.

Henry V. Allen, Stephen C. Terry, and Diederik W. De Bruin, "Accelerometer Systems with Built–In Testing," *Sensors and Actuators* A21–A23 (1990), pp. 381–386, (no month).

Kurt E. Petersen, Anne Shartel, and Norman F. Raley, "Micromechanical Accelerometer Integrated with MOS Detection Circuitry," *IEEE Trans. Electron Dev.,* vol. ED–29, No. 1, (Jan. 1982), pp. 23–27.

Z. Lisa Zhang and Noel C. MacDonald, "A RIE Process for Submicron, Silicon Electromechanical Structures," *J. Micromech. Microeng.* 2 (1992), pp. 31–38, (no month).

Kevin A. Shaw, Z. Lisa Zhang, and Noel C. MacDonald, "SCREAM I: A Single Mask, Single–Crystal Silicon, Reactive Ion Etching Process for Microelectromechanical Structures," *Sensors and Actuators A,* 40 (1994), pp. 63–70, (no month).

Burton Boxenhorn and Paul Greiff, "Monolithic Silicon Accelerometer," *Sensors and Actuators,* A21–A23 (1990), pp. 273–277, (no month).

P.E.M. Frere, "Problems of Using Accelerometers to Measure Angular Rate in Automobiles," *Sensors and Actuators A,* 25–27 (1991), pp. 821–824, (no month).

F. Rudolf, A. Jornod, J. Bergqvist, and H. Leuthold, "Precision Accelerometers with μg Resolution," *Sensors and Actuators,* A21–A23 (1990), pp. 297–302, (no month).

K. Yamada, K. Hiuchi, and H. Tanigawa, "A Novel Silicon Accelerometer with a Surrounding Mass Structure," *Sensors and Actuators,* A21–A23 (1990), pp. 308–311, (no month).

F. Rudolf, "A Micromechanical Capacitive Accerlerometer with a Two–Point Inertial–Mass Suspension," *Sensors and Actuators,* 4 (1983), pp. 191–198. (No month).

Clifford MEth, "Micomachining Improves Automotive Sensors," *Electronic Design,* Feb. 5, 1996, pp. 67–81.

Norman Martin, "Single–Point Sensation," *Automotive Industries,* Sep. 1994, pp. 98–104.

Cheryl Ajluni, "Accelerometers: Not Just For Airbags Anymore," *Electronic Design,* Jun. 12, 1995, pp. 93–106.

B. Bertuol, "Sensors as Key Components for Automotive Systems," *Sensors and Actuators A,* 25–27 (1991), pp. 95–102. (No month).

Thomas P. Matheus, "Extending the scope of ABS," *Automotive Engineering,* Jul. 1994, pp. 15–17.

Eric P. Reidemeiser and Larry K. Johnson, "Capacitive Acceleration Sensor For Vehicle Applications," SAE Paper No. 942260, SAE International Congress Truck & Bus Meeting & Exposition, Seattle, WA, Nov. 7–9, 1994, pp. 29–34.

Jack D. Johnson, Seyed R. Zarabadi, and Douglas R. Sparks, "Surface Micromachined Angular Rate Sensor," SAE Paper No. 950538, SAE International Congress & Exposition, Detroit, Michigan, Feb. 27–Mar. 2, 1995.

M. Offenberg, H. Münzel, D. Schubert, O. Schatz, F. Lärmer, E. Müller, B. Maihöfer, and J. Marek,"Acceleration Sensor in Surface Micromachining for Airbag Applications with High Signal/Noise Ratio, "SAE Paper No. 960758, SAE International Congress & Exposition, Detroit, Michigan, Feb. 26–29, 1996.

* cited by examiner

Basic components of an accelerometer

Bulk Micromachined Accelerometer

Surface Micromachined Accelerometer

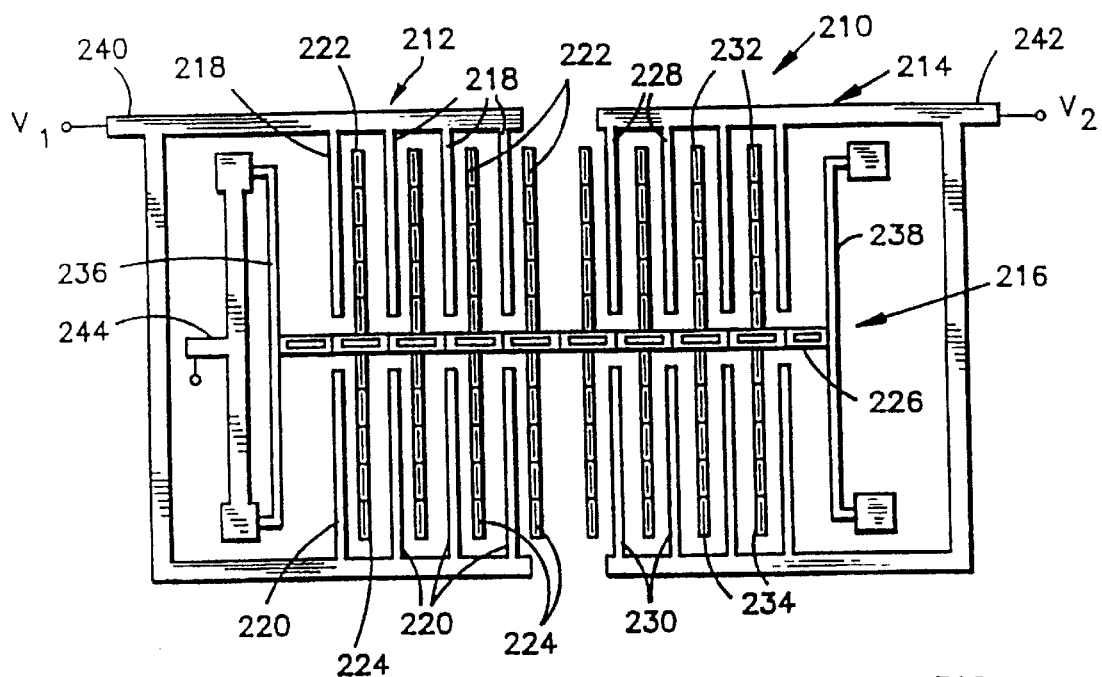
FIG. 13
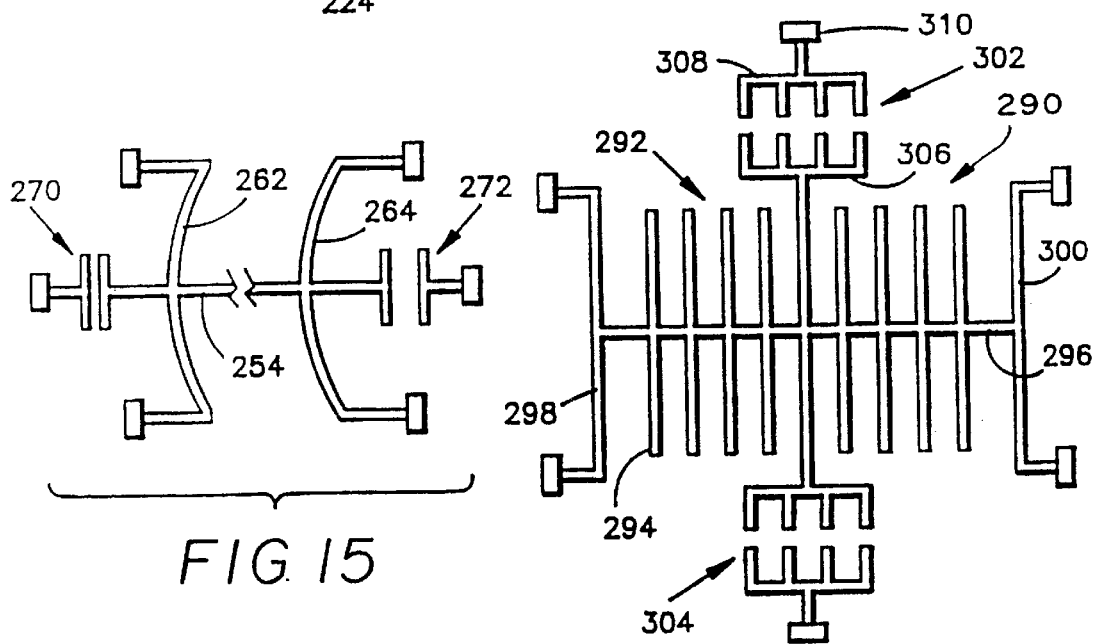
FIG. 15
FIG. 16

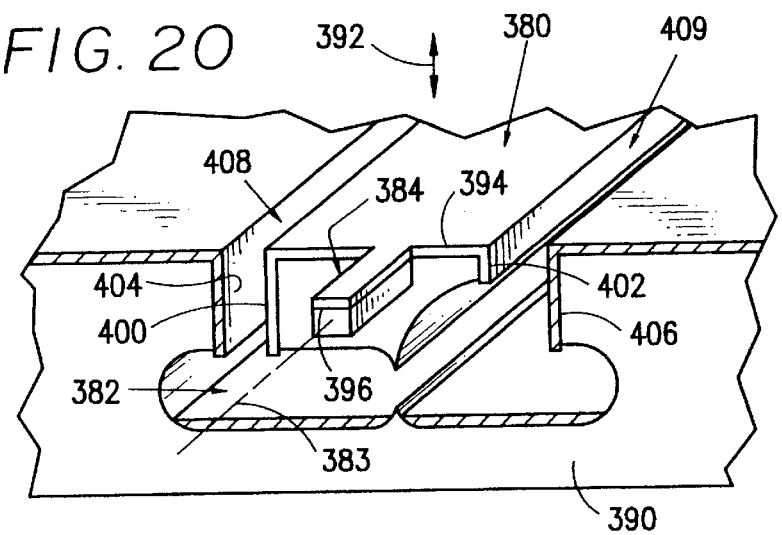
FIG. 20
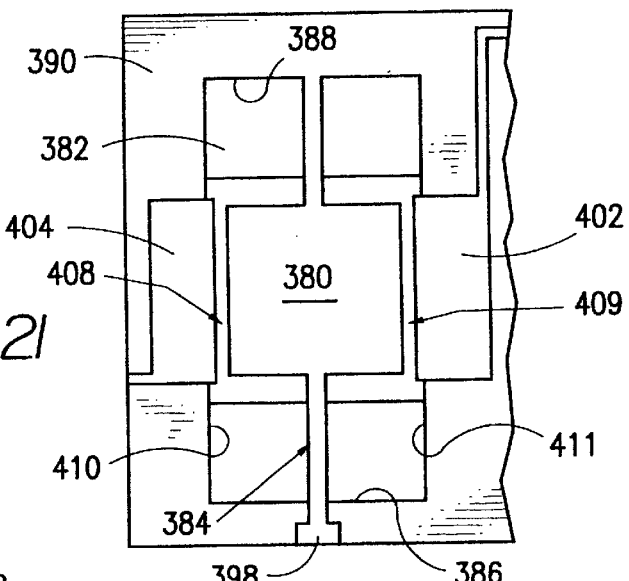
FIG. 21
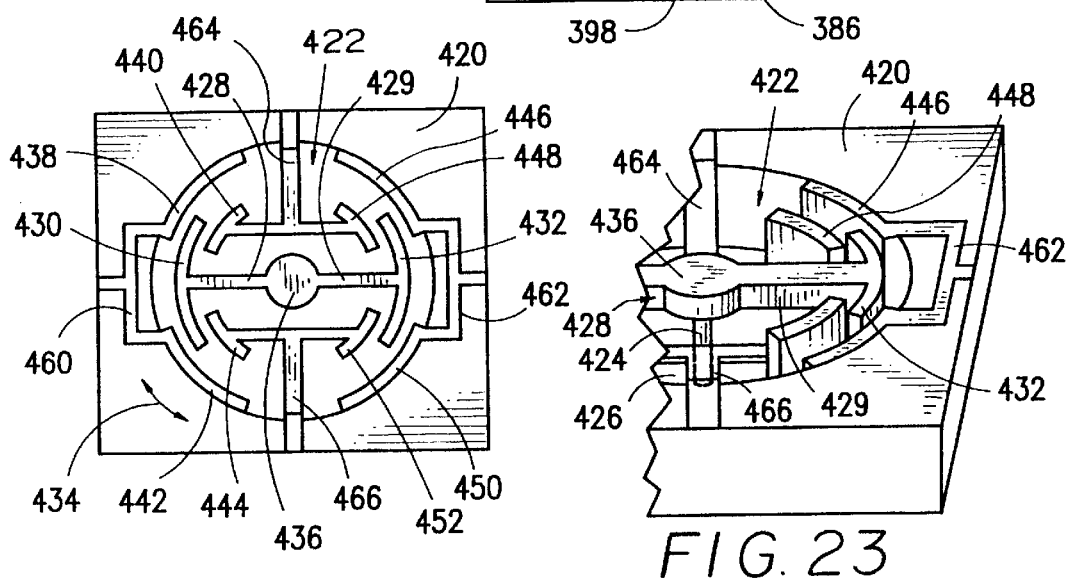
FIG. 22
FIG. 23

Definition of Key Geometrical Parameters

Electron micrograph of a preferred embodiment of a MEMS accelerometer

MICROELECTROMECHANICAL ACCELEROMETER FOR AUTOMOTIVE APPLICATIONS

This application is a continuation-in-part application of U.S. Ser. No. 08/246,265, filed May 19, 1994, now U.S. Pat. No. 5,563,543 in its entirety, which is a continuation-in-part of U.S. Ser. No. 08/067,264, filed May 26, 1993, now U.S. Pat. No. 5,610,335.

BACKGROUND

The field of the invention relates generally to accelerometry. More specifically, the field of the invention relates to a microelectromechanical accelerometer. In particular, the field of the invention relates to a microelectromechanical accelerometer fabricated from single crystal silicon, with improved performance qualities, for use in automotive and related applications, and a manufacturing method for making such accelerometers at low cost.

There is a need for automotive safety systems to collect more information about vehicle dynamics and external forces acting on the vehicle in order to make intelligent decisions as to what actions, if any, need to be taken to maintain safe vehicle operation. Collecting such information is the role of sensors, such as accelerometers, force sensors, pressure sensors, and the like. With presently available sensor technologies, only a limited number of sensors can be utilized in a vehicle before their cost becomes prohibitively high. What is required is a new, high-performance, low-cost technology for automotive sensors. Silicon-based devices and microelectronics-style manufacturing techniques are anticipated to be required to meet the price-performance objectives of automotive sensors in the future. See G. A. MacDonald, "A Review of Low Cost Accelerometers for Vehicle Dynamics," *Sensors and Actuators* A21–A23 (1990), pp. 303–307; and Robert E. Sulouff, Jr., "Silicon Sensors for Automotive Applications," *Proc. 6th Int. Conf. Solid-State Sensors and Actuators* (Transducers '91), San Francisco, Calif., Jun. 24–28, 1991, pp. 170–176.

There are numerous applications for accelerometers in automobiles, including airbag deployment (front, rear, and side impact), anti-lock brake systems, roll detection, angular rate accelerometers, electronically controlled suspension systems, steering systems, and collision avoidance systems, to name a few. Each application requires accelerometers which operate in different ranges of acceleration (from as little as $10^{-6}$ g to as much as 500 g) and bandwidth, yet all with stringent requirements on reliability, operating environment, self testability, and cost. See G. A. MacDonald, "A Review of Low Cost Accelerometers for Vehicle Dynamics," *Sensors and Actuators* A21–A23 (1990), pp. 303–307; and Robert E. Sulouff, Jr., "Silicon Sensors for Automotive Applications," Proc. 6th Int. Conf. Solid-State Sensors and Actuators (Transducers '91), San Francisco, Calif., Jun. 24–28, 1991, pp. 170–176.

Introduction of new technology to automotive applications is primarily driven by price-performance considerations. Although more intelligent safety systems are desired, the cost of those systems must continuously drop while their performance improves. If improving the system's performance requires more sensors, the price of individual sensors and their associated electronics must be correspondingly lower. Assuming a ten to twenty times increase in the number of sensors (not unreasonable considering a fully active suspension is predicted to require ten accelerometers alone) and a ten times reduction in the cost of the overall safety system, then the sensors themselves must be produced for less than one-hundredth ($\frac{1}{100}$) their current price. As a concrete example, high performance piezoelectric quartz accelerometers which could be utilized in these automotive applications currently retail for $300. The automobile industry predicts that such sensors will not be incorporated into production vehicles until a technology can be found which can supply the desired sensor for $2 to $3 per unit.

An excellent example of the commercial reality discussed above can be found in automotive airbag systems. Over the past five years a concerted effort in the industry has been made to develop a new airbag deployment subsystem costing less than one-tenth that of the current technology. Substantial investment in time and research funds have been made and functioning devices have been delivered to potential customers. However, these devices cannot meet the cost targets set out for them by the automotive industry. Hence, despite much promise, there is at present virtually no use of these new accelerometer devices in production airbag systems. The following discussion of accelerometers, and particularly micromachined accelerometers, helps to explain why these accelerometers have high cost and have not achieved widespread use in automotive applications.

An accelerometer in general is a device which senses an externally-induced acceleration. There are three major components to an accelerometer, as shown in FIG. 1. Typically, a sense element is a mass of some sort which moves in response to an applied acceleration vector. This is referred to as a mass, proof mass or seismic mass. The proof mass is held in its resting position by a spring. Some form of displacement transducer is used to measure the amount of motion the proof mass makes in response to an applied acceleration. This is then converted into an electrical output signal and may include signal conditioning electronics to provide a strengthened signal for accurate measurement of the displacement. The output signal from signal conditioning electronics then may be used by additional electronic control circuitry to determine how to respond to the detected acceleration. For example, a charge may be activated for deploying an airbag in response to a sensed acceleration vector above a pre-determined threshold. See Ernest O. Doebelin, *Measurement Systems: Application and Design,* (McGraw-Hill, New York, 1990), Chapter 4.6, incorporated herein by reference.

Present generation production airbag deployment sensors utilize physically "large" mechanical devices, such as a metallic ball held between the poles of a permanent magnet, as the accelerometer to detect impact (deceleration) of sufficient magnitude to signal deployment of the airbag, typically an impact in excess of 50 g (490 m/s$^2$). See, for example, U.S. Pat. No. 5,098,122. This type of conventional accelerometer has severe disadvantages in terms of cost, reliability, sensitivity, and self-testing ability. Thus, there is a compelling need for an alternative accelerometer technology for an airbag deployment system which provides low cost, reliable and ultra sensitive operation along with self testing capability.

Moreover, there are numerous other applications for accelerometers in automobiles such as active suspension, anti-lock braking, and active steering, and the necessary broad range of operating characteristics for active steering which cannot be met by current "large" mechanical accelerometer technology. Solid-state accelerometers based on the piezoelectric effect in many cases have been implemented in an attempt to meet the performance requirements of these additional applications. However, such conventional piezoelectric accelerometers, are too expensive and/or physically too large to be practical for implementation in automobiles. See, for example, U.S. Pat. No. 4,945,765, which notes that these large accelerometers can be several cubic inches in size and weigh a pound.

The emerging technology of micromechanical systems (MEMS) has created an entirely new approach to accelerometers (see, for example, Janusz Bryzek, Kurt Petersen, and Wendell McCulley, "Micromachines on the March," *IEEE Spectrum,* May 1994, pp. 20–31, and Lee O'Connor, "MEMS: Micromechanical Systems," *Mechanical Engineering,* Feb. 1992, pp.40–47). Numerous patents have been issued for a variety of micromechanical accelerometers over the past fifteen years (for example, U.S. Pat. Nos. 4,483,194; 4,553,436; 4,736,629; 4,945,765; 5,126,812; 5,249,465; and 5,345,824). The earliest of these patents, as well as research papers from the late '70's made reference to the potential application of micromechanical accelerometers in automotive applications based on the potential of MEMS to meet both the cost and performance requirements described above. Yet as far as is known at this time, few MEMS accelerometers are used in automotive applications.

MEMS utilizes microelectronic processing techniques to reduce mechanical components to the scale of microelectronics. In some cases, it is even possible, although quite difficult, to place both the mechanical components and electronics onto a common silicon chip. MEMS offers the opportunity for integrating mechanical sensor elements and their associated signal processing electronics onto a single chip in a common manufacturing process, if a viable process for this integration can be found. This integrated approach is in stark contrast to existing technology in which separate manufacturing processes and facilities must be used to fabricate the mechanical components and the electronic components. Those individual components then must be assembled together in the final package. This results in manufacturing complexity and greatly increases the cost of the final product. Consequently, MEMS offers the potential for substantial reductions in size and weight, and tremendous improvements in cost, performance, and reliability when compared to existing technology.

Two principal fabrication technologies are used to create MEMS devices: bulk and surface micromachining. See, for example, U.S. Pat. Nos. 4,736,629 and 5,345,824; Theresa A. Core, W. K. Tsang, and Steven J. Sherman, "Fabrication Technology for an Integrated Surface-Micromachined Sensor," *Solid State Technology, October* 1993, pp. 39–47; and Wolfgang Kuehnel and Steven Sherman, "A surface micromachined silicon accelerometer with on-chip detection circuitry," *Sensors and Actuators A* 45 (1994), pp. 7–16; Frank Goodenough, "Airbags Boom When IC Accelerometer Sees 50 g," *Electronic Design,* Aug. 8, 1991, pp. 45–56; Lynn Michelle Roylance and James B. Angell, "A Batch-Fabricated Silicon Accelerometer," *IEEE Trans. Electron Dev.* ED-26 (1979) pp. 1911–1917; Lj. Ristic, D. Koury, E. Joseph, F. Shermansky, and M. Kniffin, "A Two-Chip Accelerometer System for Automotive Applications," *Proc. MicroSystem Technologies '94,* Berlin, Oct. 19–21, 1994, pp. 77–84; and U.S. Pat. No. 5,249,465.

Bulk Micromachining

Conventional MEMS technology which relies upon a bulk micromachining process to produce structures in silicon has disadvantages for accelerometer applications.

Bulk micromachining utilizes certain chemical etchants, most notably aqueous potassium hydroxide (KOH and aqueous ethylenediamine pyrocatechol (EDP), which preferentially etch along certain crystal planes in silicon. These chemicals can be used to sculpt out certain geometric structures in silicon.

Since bulk micromachining uses wet chemicals to etch preferentially along certain crystallographic planes in silicon, this has the disadvantage of limiting the shapes of the structures to ones that correspond to those atomic planes, typically pyramidal structures.

The depth of the etch is determined by the chemical composition of the etching solution, the localized conditions under which etching is performed (e.g. temperature, concentration, extent of turbulence or convection, etc., at the particular location and crystal plane being etched), and the time allowed for etching to take place. Mask materials, such as silicon dioxide or silicon nitride, are used to protect areas of the silicon which are not to be etched, although these areas may be undercut by the etchant under certain conditions.

Bulk micromachining is very limited in terms of the resolution, accuracy, and repeatability with which it can define structures and the geometries of those structures. Etch rates vary with the type of crystal plane being etched, and exact and precise control of reaction conditions and times is essential to obtain a micromachined device of the geometry desired. The process is, furthermore, extremely difficult to integrate with conventional microelectronic device fabrication techniques, thereby essentially precluding the integration of the mechanical components and electronic devices on a single chip.

Most often bulk micromachining techniques require bonding a second silicon wafer or other substrate material to the original wafer containing the etched structures. FIG. 2 illustrates one such bulk micromachined accelerometer. The sense element is formed by chemically etching a first silicon wafer from the backside to remove material, leaving a trapezoidal block of silicon, the mass, suspended by thin silicon membranes on either side of it. The depth of etch in this example is controlled by first implanting the front side of the silicon wafer with an etch-stop layer, typically boron, at the desired depth. When the chemical etchant encounters this layer, its etch rate drops to almost zero. The silicon membranes are thin enough that they allow the mass to move in the vertical direction (out of the plane of the wafer) under applied acceleration. The membranes serve the function of a spring.

Referring to FIG. 2, a second silicon wafer, etched in a similar manner, is then bonded to the first to form the cavity in which the mass resides. This second wafer also provides overrange stops (not shown) to prevent the mass from moving too far and damaging itself. A third wafer (not shown) similar to the bottom one can be bonded on top to provide overrange protection in the other direction, as well as a self-test ability. See Henry V. Allen, Stephen C. Terry, and Diederik W. De Bruin, "Accelerometer Systems with Built-in Testing," *Sensors and Actuators* A21–A23 (1990), pp. 381–386, and Lynn Michelle Roylance and James B. Angell, "A Batch-Fabricated Silicon Accelerometer," *IEEE Trans. Electron Dev.* ED-26 (1979), pp. 1911–1917.

The conventional bulk micromachined accelerometer as shown in FIG. 2, is difficult to manufacture. Three different wafers must be etched and processed, then all are bonded together. Bonding the three wafers is a difficult task and only can be performed at a high temperature. Such a high temperature process precludes the inclusion of any electronics on any of the wafers involved. Thus, a second chip must be used to carry the electronics. The number of process steps, wafers, and calibration of the piezoresistors (trimming) results in a very expensive and relatively complex device.

Control over the wet chemical etch is difficult in a bulk micromachining manufacturing process in terms of run-to-run repeatability and uniformity across a wafer. Ion implanted etch stops alleviate some of the uniformity issues; however, they introduce high temperature annealing stresses and have a very limited range of depths to which the implant can reach. Since the etching process is incapable of creating a released structure, such as a cantilevered beam over a surface, a second wafer or other material such as glass or metal must be bonded to the etched wafer to create a released structure.

Thus, bulk micromachining precludes the formation of a highly desirable feature such as a released structure, for example, a released cantilevered beam over a surface. Such released structures are necessary to form electrical contacts beneath certain micromechanical structures for capacitive sensing, actuation, and the like.

Therefore, it would be highly desirable to be able to fabricate a released structure such as a cantilevered beam over a surface for accelerometer applications. Such an accelerometer would be extremely compact and sensitive to an applied acceleration. In addition, the cantilevered beam would provide an inherent spring for returning the beam to a stable sensing position.

Bulk micromachining also requires wafer bonding which limits the ability to integrate such an accelerometer with signal conditioning circuitry or other electronics which are required for production of an accurate output signal. Wafer bonding is a high temperature process which precludes having pre-existing electronic devices on any wafer involved. It further creates stresses in the structures which can lead to other problems or device failure. It is, furthermore, an additional process step which adds to the cost of the device.

Surface Micromachining

To overcome some of the problems associated with bulk micromachining, various researchers developed a process known as surface micromachining. In surface micromachining, a sacrificial layer of silicon dioxide ("oxide"), or other appropriate material, is first deposited on the surface of the silicon wafer. A second layer consisting of polycrystalline silicon ("poly") is then deposited on top of the oxide. The poly is patterned into desired mechanical structures using conventional semiconductor processing techniques. Finally, the oxide is etched out from under the poly, leaving the mechanical structures free to move. This process solves the resolution and structure geometry limitations of bulk micromachining.

FIG. 3 illustrates a conventional accelerometer formed with surface micromachining. Such a surface micromachined accelerometer is exemplified by U.S. Pat. No. 5,345,824. The sense element (mass), which consists of an array of fingers extending from a backbone, is formed from the deposited polysilicon layer and is suspended from tethers at either side. The ends of the tethers are attached to an underlying silicon substrate (not shown for clarity), as are the fixed electrodes. The tethers provide the spring function shown for the generic accelerometer of FIG. 1.

Surface micromachining, however, has a number of limitations of its own in terms of practical applications. The height of the mechanical devices formed by surface micromachining is determined by the thickness of the poly layer in which devices are formed. That thickness is in turn limited by stresses which are inherently developed in the poly film during the deposition process. The practical limitation on such film thickness before catastrophic failure is between two and four micrometers (2–4 $\mu$m). Even when the poly layer is held to less than these limits, stresses can result in films which are not planar relative to the substrate wafer. Also, such films may be characterized by a planarity which varies from one deposition run to the next, resulting in non-reproducible results in manufacturing. As will be described in detail below, the small height of the mechanical structures (<4 $\mu$m) formed in surface micromachining severely limits the performance of MEMS devices fabricated in this manner. These limitations have particular negative impact on the ability of this technology to meet the requirements of automotive accelerometers.

Another major limitation to surface micromachining relates to manufacturability. The release of the mechanical structures must be obtained by removing the sacrificial layer out from under the poly. That release step is most often accomplished with a wet chemical etchant which will selectively remove oxide, notably hydrofluoric acid (HF), followed by a rinse to remove any acid residue. During this procedure the surface tension (capillary) forces present are often of sufficient magnitude to cause the thin poly structures to be pulled down into contact with the wafer substrate and to stick in that position, thereby rendering the device unusable. This problem is sufficiently widespread that it has been given the name "stiction" and is the subject of several research papers. Failure by stiction reduces the manufacturing yield of surface micromachined MEMS devices, thereby increasing their unit costs.

U.S. Pat. No. 5,314,572 discusses at length the problem of stiction. The '572 patent presents a complex two stage process to attempt to avoid stiction. The '572 patent points out that one needs to use a plasma etch to do the release step. However, since the '572 patent teaches the use of polysilicon as the mechanical material, plasma etching cannot be used to remove a sacrificial oxide layer as the oxide etch is not selective enough over polysilicon and such a process would consume too much polysilicon. Thus, an objective of the '572 patent is to end up with a photoresist "polymer" sacrificial layer which can be plasma etched with sufficient selectivity over polysilicon. However, one cannot start with a polymer sacrificial layer since the deposition temperature (600° C.) of polysilicon is far higher than a polymer can withstand. Thus, a complex manufacturing process is required: making a first sacrificial layer of oxide, then depositing polysilicon, etching away the oxide chemically, returning and filling holes with photoresist, finishing the micromachined structure, and lastly using a plasma etch to remove photoresist supports holding up the polysilicon structures to be released. Such a manufacturing process is complex, suffers from problems of reproducibility and increased cost. In addition, it is not clear that such a process overcomes entirely the problem of stiction.

Integration With Displacement Transducer Circuitry

A further problem of the surface micromachining process is its limited ability to be integrated with conventional microelectronics device processing techniques. The wet chemical etch associated with the release step and the moderately high temperature (approximately 600° C.) of polysilicon deposition are incompatible with aspects of microelectronic device fabrication (e.g. implanted boron migrates readily at 600° C., so implantation and other electronics fabrication cannot occur until after polysilicon is deposited). This problem results in a very complex process if both mechanical and electronic devices are to be fabricated on a single chip. Such complexity results in low yields in manufacturing and thus high unit costs.

An approach to avoid integration problems is to use two chips, one for the surface micromachined sense element and transducer, and one for the signal conditioning electronics. See L. Ristic, D. Koury, E. Joseph, F. Shermansky, and M. Kniffin, "A Two-Chip Accelerometer System for Automotive Applications," *Proc. MicroSystem Technologies '94*, Berlin, Oct. 19–21, 1994). Although the two chip approach avoids the problems of integrating surface micromachining with conventional microelectronic device processing, it results in a larger, more complex, and more costly accelerometer.

In solid-state and micromechanical accelerometers, two displacement transducers are commonly used, piezoresistive and capacitive. The transducers provide a means for converting the movement of the proof mass or inertial mass into an output signal representative of the sensed acceleration. In piezoresistive transduction, motion of the mass is transduced by the change in resistance of a piezoresistive material as it is deformed (expanded or contracted). Such a device can be readily created by ion implantation of an appropriate dopant into thin sections of silicon attached to the mass (see FIG. 1 for example). The major limitation to piezoresistive schemes is that the piezoresistor is strongly influenced by temperature. Hence, costly compensation electronics are required to mitigate the effects of changes in temperature on the device's performance. Piezoresistors are also sensitive to stress which may be introduced during processing or mounting of the device in its package or on the vehicle.

To alleviate the problems associated with piezoresistive transducers, most accelerometer devices today utilize a capacitive transducer. In this approach, motion is transduced by having that motion alter the capacitance of a structure. Changes in capacitance are readily measured electronically and are relatively unaffected by changes in temperature. This technique is illustrated in FIG. 3 for the surface micromachined accelerometer. Motion of the suspended polysilicon mass changes the spacing between the fixed and suspended electrodes, thereby enabling a measurement of the change in capacitance as a function of the mass' motion.

Many bulk micromachined accelerometers use a second wafer bonded to the first to obtain an electrode beneath the bulk micromachined movable structure. See U.S. Pat. No. 4,483,194 and Kurt E. Petersen, Anne Shartel, and Norman F. Raley, "Micromechanical Accelerometer Integrated with MOS Detection Circuitry," *IEEE Trans. Electron Dev.* ED-29 (1992), pp. 23–27. A serious drawback to the design presented in '194 as compared with that shown in FIG. 3 is the highly nonlinear variation in capacitance with motion which results from '194's cantilevered beam, or "flap." This design is further limited in terms of manufacturing as it requires bonding of two wafers, and the device responds to acceleration perpendicular to the plane of the wafer. This makes mounting the device in the vehicle more difficult. The preferred method is to sense acceleration in the plane of the wafer.

Another example of conventional capacitive transduction with bulk micromachining is provided in U.S. Pat. No. 4,736,629. In this instance, a silicon wafer is processed using conventional microelectronics device fabrication techniques to form the fixed electrodes and the signal conditioning electronics. The wafer is then covered with a passivation layer (e.g. glass) which is patterned with lithography and chemical etching. Metal is deposited on the passivation layer, portions of which are then etched out from under the metal, leaving a suspended metal structure which forms the mass and the movable portion of the capacitor. The resulting device consists of a metal plate having two movable electrodes of two separate capacitors supported by a metal pedestal above the surface of an insulated silicon substrate that also has two fixed electrodes which, in conjunction with the electrodes on the metal plate, form the two capacitors used in the disclosed accelerometer. The capacitance of one capacitor is compared to the capacitance of the other capacitor, and the difference between these capacitances is used to determine the acceleration.

The accelerometer of the '629 patent has a single moving element, the metal plate. This has the disadvantages of very small capacitance and a correspondingly small output signal. Parts formed from metal have inferior fatigue properties when contrasted with silicon. Furthermore, the change in capacitance with motion is highly nonlinear (see also the above paragraph on nonlinear capacitance for a suspended flap). The device has a very small output signal and requires a second chip of electronics to process the output signal into a signal that can be transmitted to and used by other electronic components, such as the electronics that trigger deployment of an airbag. This device also measures acceleration perpendicular to the plane of the wafer and therefore suffers from the problems associated with this method, as discussed previously.

Problems of Conventional Displacement Transducers

A further disadvantage of conventional accelerometers is the difficulty in integrating the transducer and associated signal conditioning circuitry on a single chip.

U.S. Pat. No. 5,345,824 discloses an acceleration sensor and signal conditioning circuitry that is said to be formed on the same chip on which the sensor is placed. U.S. Pat. No. 5,314,572 discloses the method of making this accelerometer. The accelerometer comprises polycrystalline silicon ("poly" or "polysilicon") and fixed and movable beams forming two capacitors that are suspended above the surface of a silicon substrate by polysilicon posts. Two capacitors are formed above the surface, and the difference in capacitance between the two capacitors is used to determine the acceleration. The process of making the accelerometer begins by depositing a sacrificial oxide layer on a silicon wafer and etching holes in the oxide layer where the polysilicon support posts are to be. Polysilicon is then deposited onto the oxide layer requiring a temperature of approximately 600° C.

This has the problem of precluding fabrication of many electronics components on the wafer (at least to this point in the process). The polysilicon is then etched, and oxide is subsequently etched using a liquid isotropic etch designed to undercut the poly layer. A photoresist is deposited and etched to provide short photoresist posts that support the suspended capacitive fingers and prevent "stiction" (i.e. bending of the suspended fingers and adhesion to the substrate surface) in subsequent wet etch, rinse, and drying steps that remove the sacrificial oxide layer. Any remaining photoresist is removed via, e.g., oxygen-plasma stripping. Presumably, once the sensor has been fabricated, associated electronics can then be etched into the surface of the wafer and connected to the sensor. This process suffers from problems of manufacturing complexity, associated high cost and stiction, or bonding of moving components as previously described.

U.S. Pat. No. 5,345,824 also illustrates other problems associated with a conventional surface micromachining process. The thickness of the polysilicon which can be deposited is limited to approximately 3–5 microns. Thus, the aspect ratio of structures which can be formed using surface micromachining is very limited. Aspect ratio (or beam height) plays a critical role in providing sufficient capacitance to detect minute deflections of the sensing element or proof mass induced by varying or low levels of acceleration. For example, the '824 patent states that the device capacitance available is very small, with total device capacitance being approximately 0.1 pF [col. 5, line 1–2, and 6]. An inventor of the '824 patent shows that one-half of the transducer signal is lost because the lowest input capacitance signal conditioning electronics available has approximately 0.1 pF of stray capacitance. That is, on the same order as the transducer itself. This results in a 6 dB or one-half reduction in signal strength. Such a device lacks essential sensitivity to minute deflections induced by varying acceleration levels. Accordingly, a device as taught by the '824 patent would be unsuited for applications requiring extreme sensitivity to low level accelerations at low frequencies.

For example, in electronic brake distribution (EBD) systems, relatively low-level, wheelslip signals available during braking must be sensed in order to modify brake pressures for optimized distribution. A conventional accelerometer would be too insensitive for applications such as active steering, wherein the output signals of an extremely accurate accelerometer would be needed to alter vehicle handling dynamics such as by applying signals for modifying brake torque to actively achieve a desired objective such as skid avoidance.

Conventional accelerometers lack the sensitivity to detect minute changes in acceleration or to distinguish accurately dynamically changing acceleration vectors such as tilt, inertia, shock or vibration. In an attempt to overcome problems of insensitivity, U.S. Pat. No. 4,711,128 discloses a multi-finger capacitive accelerometer that appears to have been fabricated from a thin slice of quartz. The patent is silent on how the accelerometer was fabricated, as is U.S. Pat. No. 4,663,972 to which '128 refers, other than to say that the accelerometer was "micromachined". Semiconductor devices are not fabricated from quartz, an oxide of silicon, so it would not be possible to produce a wafer having the accelerometer and electronics on a single substrate. An accelerometer of '128 would be expected to be extremely delicate and therefore have very low yields when manufactured or attached to a silicon substrate containing the electronics to process the signal from the '128 accelerometer.

U.S. Pat. No. 4,483,194 discloses an accelerometer that requires two layers that are glued to each other, each of which carries an electrode that together form a capacitor. The accelerometer comprises a first layer of a silicon substrate from which the first electrode is fabricated via, e.g., reactive ion etching, and a second layer such as glass that carries the second electrode. This multi-layer device measures the change in capacitance caused by the capacitor plate on the flap or vane on the substrate flexing about resilient attachment means such as pivots. The multi-layer accelerometer is expected to have disadvantageously very small changes in capacitance, and it also measures accelerations normal to the plane of the substrate or otherwise out of the plane of the substrate.

U.S. Pat. No. 5,249,465 discloses an accelerometer having a polysilicon seismic mass supported above a silicon wafer by polysilicon springs and pedestal. Fixed polysilicon electrodes are anchored to the substrate and are suspended above the seismic mass by polysilicon supports. A pair of capacitors are formed, comprising (1) a fixed electrode on the polysilicon suspended above the seismic mass and a movable electrode on the upper face of the polysilicon seismic mass; and (2) a fixed electrode on the silicon wafer and a movable electrode on the lower face of the polysilicon seismic mass. Pairs of electrodes are distributed about the seismic mass and are used in conjunction with springs to maintain the seismic mass in a neutral position. This accelerometer requires deposition of polysilicon at temperatures that are incompatible with electronic components that might have been formed on the silicon wafer prior to forming the accelerometer, and the accelerometer is not fabricated from the silicon wafer, but rather must be fabricated onto the wafer by depositing polysilicon onto the wafer.

U.S. Pat. No. 5,357,803 also discloses a multi-layered accelerometer where a polysilicon structure is formed above a sacrificial layer of oxide formed on the surface of a silicon wafer substrate. This accelerometer suffers from the same problems discussed in the previous paragraph.

Capacitive transduction has limitations of its own, the most important being parasitic capacitance in the sense element and signal conditioning electronics. Since micromechanical devices are of very small size, the capacitance of the transducer is inherently quite small, and therefore any parasitic capacitance elsewhere can be a significant factor in the overall device performance. Many times, the parasitic capacitance is of the same magnitude as the signal itself, reducing signal strength by 50% or more.

Capacitive transducers are also sensitive to electromagnetic interference, a factor which must be accounted for in the signal conditioning electronics. Signal conditioning electronics for capacitive transducers is in general more complex than that required for piezoresistive transducer schemes. Because of these shortcomings and problems, capacitive accelerometers have not been employed in demanding applications requiring ruggedness, reliability, accuracy, long device lifetime and low cost, e.g., automobiles.

Conventional bulk and surface micromachined accelerometers clearly demonstrate the need for microelectromechanical replacements for conventional large accelerometers in automotive applications. While surface micromachining along with capacitive transduction has alleviated many of the problems associated with bulk micromachining and piezoresistive transduction means, it has, however, introduced a new set of problems which limit device performance and increase manufacturing costs. Thus, conventional microelectromechanical accelerometers are not suitable for use in a vehicle, or like applications in which the accelerometer must be characterized by small size, little weight, low cost, linear and in-phase performance, high stiffness, high capacitance, axis of operation in the plane of the plane of the substrate, self testability, or the like. The foregoing shortcomings of conventional accelerometers exist, despite the prediction approximately fifteen years ago that MEMS offered the ability to fabricate such a device.

Accordingly, what is needed is a microelectromechanical accelerometer with superior price-performance characteristics to be applied to automotive applications. In particular, it would be desirable to provide a small, low-cost accelerator capable of providing a strong linear output signal with little phase-shift and which is fabricated in or from a single silicon substrate.

What is also needed is a new process for fabricating microelectromechanical systems (MEMS) which can produce accelerometers capable of meeting the performance requirements of the automotive applications while being manufactured at very low cost. Such a MEMS fabrication technology should be capable of producing an integrated micromechanical and microelectronic device on a single chip with high yield in manufacturing.

What is also needed is a microelectromechanical accelerometer with high aspect ratio structures that are capable of withstanding high impact forces and which are resistant to out-of-plane and transverse motion. It would be desirable if such high aspect ratio structures could be utilized to create accelerometer devices with high capacitance for capacitive transduction of acceleration. It would be desirable if such devices could be fabricated from single crystal silicon material for improved mechanical and electrical properties. It is also an object that these devices have a capacity for self testing in a preferred embodiment.

Further, what is needed is a technology for microelectromechanical accelerometers which can satisfy not only the present needs for airbag deployment systems, but also projected future automotive needs including side impact, anti-lock braking, electronically controlled suspension, collision avoidance, inertial navigation, or the like.

SUMMARY

In order to achieve the foregoing and to overcome the problems inherent in conventional methods for producing microelectromechanical accelerometers, a first aspect of the present invention comprises a single crystal silicon, microelectromechanical capacitive accelerometer, preferably fabricated using reactive-ion etching, which exhibits improved performance and manufacturability.

In another aspect of the invention, an accelerometer produces an output in response to an applied input acceleration and comprises at least two capacitively-coupled fingers, at least one of which fingers moves relative to an other finger to produce a change in capacitance, wherein the fingers comprise moveable released structures which are made from the same substrate by etching the substrate, and at least a portion of the etching is reactive-ion etching. A means for applying a potential across the fingers is provided to generate an output signal of improved linearity indicating the change in capacitance of the movable finger relative to the other finger.

In another aspect, an accelerometer comprises a variable-capacitance capacitor having fingers or interdigitated structures, wherein the fingers of the accelerometer are made from the same substrate by etching the substrate, and at least a portion of the etching is reactive-ion etching, and the accelerometer generates a substantially linear output signal in response to the acceleration. The elimination of adhesive bonding and multiple components results in a design with extremely high reliability and sensitivity to low levels of acceleration.

A further aspect of the invention provides for a micromechanical accelerometer comprised of high aspect ratio single crystal silicon structures. The structures are characterized by an aspect ratio of at least about 4:1, more preferably at least about 6:1 and most preferably at least about 15:1. This aspect of the invention advantageously enables the device to have high resistance to mechanical impact and high out-of-plane stiffness.

It will be appreciated that the fabrication of the moving sense element or proof mass with a high aspect ratio from the same substrate of single crystal silicon substantially eliminates misalignment of the surface of the sense element with the mounting surface. This has the advantage of substantially eliminating transverse sensitivity, or spurious output due to accelerations which are transverse to the sensitive axis of the accelerometer.

A further benefit of the high aspect ratio structures is larger total device capacitance for more accurate transduction of motion. Larger capacitance achieves higher signal-to-noise ratios, substantially reduces detrimental effects from parasitic capacitance, and reduces demands on signal conditioning electronics.

Also provided in an aspect of the invention is a low temperature, reactive ion etching process for making an accelerometer from a substrate, wherein the process comprises etching a pattern in the substrate using reactive ion etching, thereby creating interdigitated structures or fingers; releasing a portion of the etched substrate to form a movable portion of the substrate; depositing metal on the substrate under conditions sufficient that the movable portion of the substrate capacitively couples with at least a portion of the remainder of the substrate, and connecting the substrate to a means for applying a potential across the fingers of the movable and remainder portions of the substrate and generating an output signal indicating the acceleration.

In another aspect of the invention, a microelectromechanical accelerometer including a sensing element or mass and a capacitive transducer are fabricated using reactive-ion etching of a wafer having pre-existing microelectronic circuitry without damaging the electronics. Fabricating the micromechanical structures with reactive ion or plasma etching has the advantage of substantially eliminating high temperature process steps and wet chemical etch steps which would adversely affect pre-existing electronic devices and metal interconnections contained therein.

A further aspect of the present invention is the fabrication of an accelerometer entirely from a single wafer of single crystal silicon. This enables an active signal conditioning element such as a transistor to be fabricated directly into a moving silicon beam or proof mass. A transistor now provided in the surface of a proof mass enables thermal and mechanical strains, normally associated with a mounting surface, to be closely coupled to the transducer output. A transistor integrated with the sensing element also can substantially eliminate problems of nonlinearity, and signal distortions due to parasitic capacitance. This provides the advantage of much more sensitive detection of the motion of the proof mass and enhanced accuracy of the output signal representative of the applied acceleration.

This aspect of the invention enables an accelerometer to achieve seemingly incompatible objectives of ruggedness and extreme sensitivity. Such an accelerometer would be especially useful in automotive applications including airbag deployment, anti-lock braking, electronic suspension, collision avoidance, vehicle navigation, and roll detection.

Single crystal silicon also eliminates grain boundaries and unconformities in the silicon structures and enables the resonant frequency of a sensing element, such as a released beam, to be predetermined.

The foregoing and other aspects of the invention are based on the technical finding that capacitive accelerometers of this invention can be made accurately and repeatably to have high linearity, low parasitic capacitance losses, excellent phase response characteristics, and high capacitance due to the high aspect ratio geometry of the sensing elements made from single crystal silicon using reactive-ion etching.

A microelectromechanical accelerometer fabricated according to the foregoing aspects of the invention has an important advantage in that it can be configured to have substantially any geometry that is desired. Its geometry is determined by a deep and direct etch of single-crystal silicon that is not limited by, e.g., different etch rates because of wet-chemical etching along different crystal planes, depth of boron implantation, internal stresses present in polysilicon, the requirement that the accelerometer have a released structure, and thickness of additional layers bonded to or deposited on the single crystal wafer.

A capacitive accelerometer of this invention can measure acceleration in the plane of the accelerometer, making mounting of the accelerometer in its intended use quite easy. Further, a capacitive accelerometer of this invention can produce highly accurate output signals representative of an applied input accelerometer. At the same time the accelerometer can be made quite small because of the ability to fabricate both the sensing element and signal-processing and other electronics such as VLSI electronics from the same silicon wafer to form a signal-conditioned accelerometer and integrated accelerometer, respectively, which substantially reduces parasitic losses of the capacitance signal and provides a single wafer having many components.

A further advantage of a preferred accelerometer of this invention is the ability to fabricate electronics prior to, concurrently with, or subsequent to fabricating the accelerometer. This provides a significant advantage in terms of modularity and facilitates integration of the present microelectromechanical accelerometer with existing, prepackaged VLSI circuitry adapted for a wide variety of applications. Such an accelerometer can be made inexpensively and in high yield.

BRIEF DESCRIPTION OF THE DRAWINGS

FIG. 13 is a diagrammatic top plan view of a third embodiment of the invention;

FIG. 15 is a partial top plan view of the embodiment of FIG. 14, illustrating the effect of an accelerating force on the control of FIG. 14;

FIG. 16 is a diagrammatic top plan view of a fifth embodiment of the invention, illustrating a modified control structure;

FIG. 20 is a diagrammatic partial perspective view of a seventh embodiment of the invention, illustrating an accelerometer which produces torsional motion in response to vertical acceleration;

FIG. 21 is a top plan view of the device of FIG. 20;

FIG. 22 is a diagrammatic top plan view of an eighth embodiment of the invention, illustrating an accelerometer responsive to torsional motion;

FIG. 23 is a partial top perspective view of the device of FIG. 22;

DETAILED DESCRIPTION

Process For Making a Microelectromechanical Accelerometer

In one embodiment of the invention, capacitance-based accelerometers are fabricated utilizing a modified version of the process known as Single Crystal Reactive Etching And Metalization (SCREAM-I), which is a low temperature, single-mask micromachining process which permits construction of high aspect ratio single crystal silicon beams and other structures in or from a single wafer. The typical maximum temperature at which the SCREAM-I process operates is 300° C.

Although it is possible to use multiple masking steps to make an accelerometer of this invention, a single mask that establishes the overall structure of the accelerometer is preferred in order to reduce the number of processing steps and to provide accurately-formed accelerometers from one batch to the next. The process is one that utilizes process steps typically encountered in semiconductor fabrication, allowing single or multiple accelerometers to be fabricated simultaneously in a single wafer, and enabling fabrication of an accelerometer in a wafer that is to have other electronic components fabricated in or on it, or in a wafer that has electronic components in or on it that are partially or fully fabricated.

Figure 1:
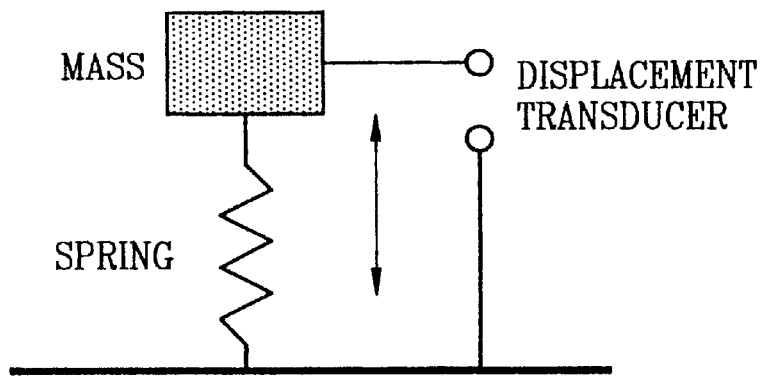
FIG. 1 shows the basic components of an accelerometer.
Figure 2:
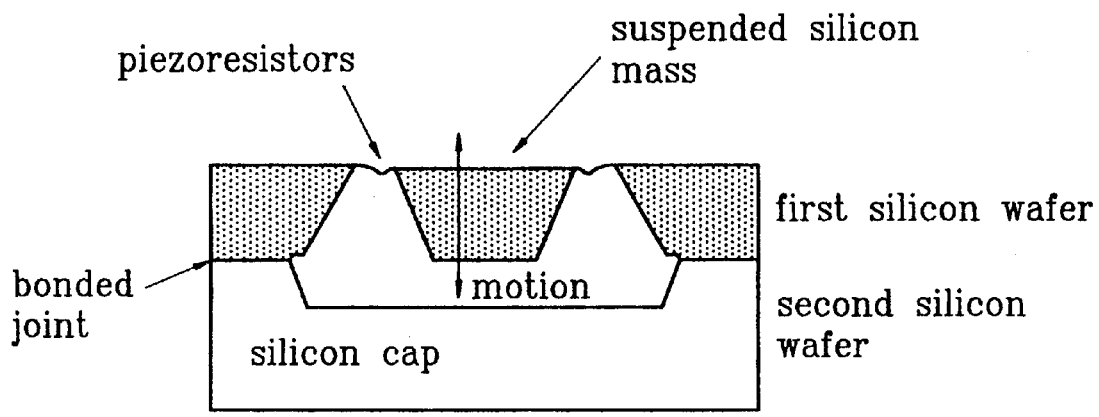
FIG. 2 illustrates a conventional multi-layer, bulk micromachined accelerometer formed by bonding two silicon wafers together.
Figure 3:
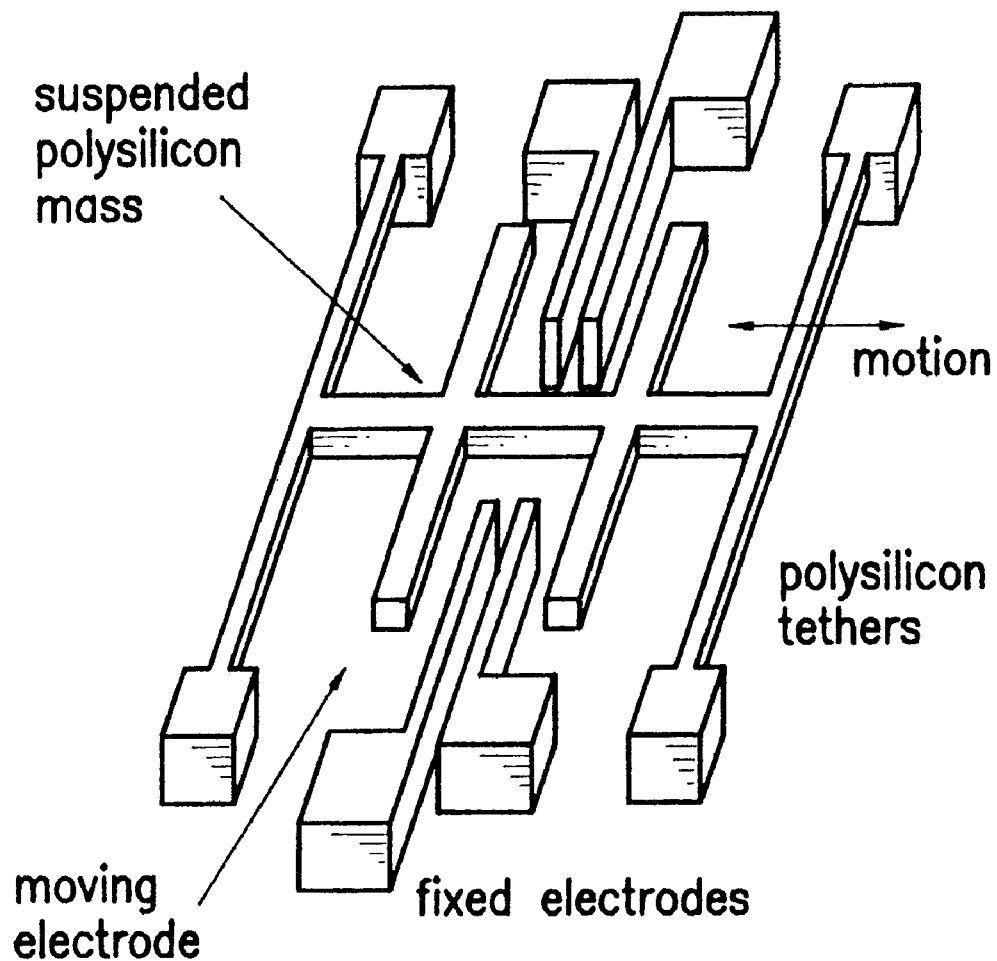
FIG. 3 illustrates a conventional multi-layer surface micromachined accelerometer formed by depositing polycrystalline silicon onto a silicon wafer.
Figure 4:
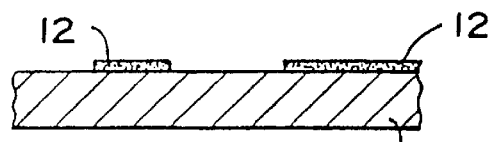
FIGS. 4–8 are diagrammatic illustrations of a fabrication process in accordance with an aspect of the present invention.
Figure 5:
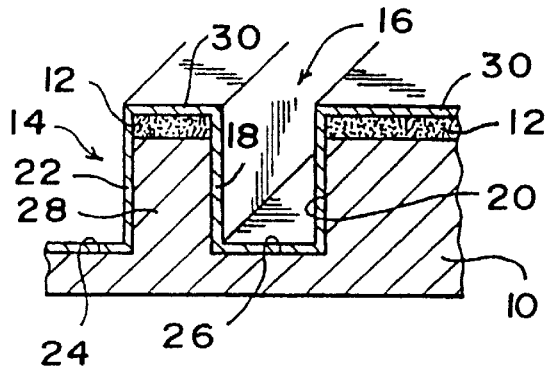

A basic, single-mask reactive-ion etching process of this invention is illustrated in FIG. 4 and may be summarized as follows. Photoresist is deposited and patterned on top of a layer of silicon dioxide (a). After the pattern is transferred using reactive ion etching, the silicon dioxide serves as a hard mask during a deep silicon trench etch (b). A layer of silicon dioxide is conformably deposited over the entire structure, and unwanted oxide on the floor of the trenches is removed using another reactive ion etch step (c). The silicon mesa, to become a released cantilevered beam, is undercut with a nearly isotropic reactive ion etch. The etch undercuts those areas not protected by silicon dioxide, leaving the beam in the center free to move laterally (d). Finally, a self-aligned metal layer is deposited over the entire structure to provide electrical connection (e).

The modified SCREAM-I process, which is diagrammatically illustrated in FIGS. 4–8, begins with a single crystal silicon wafer 10 which provides the substrate in which the accelerometer is to be constructed. The substrate is preferably single-crystal silicon such as that grown in the Czochralski process, although the substrate may be any material that is capable of being etched with a reactive ion etch and coated with metal to form capacitively-coupled fingers. Other suitable substrates include: a single-crystal silicon wafer with a layer of epitaxial silicon or polysilicon; a multi-layer wafer comprising silicon layers that are insulated from each other by, e.g., amorphous silica layers; quartz; silicon-germanium heterostructure materials; silicon-on-insulator (SOI) wafers; or other single crystal materials such as, for example, gallium arsenide. The wafer may be a 1 mohm cm arsenic single-crystal silicon wafer, for example, on which is deposited a mask such as PECVD silicon dioxide layer 12. This oxide layer serves as the etch mask throughout the fabrication process. Other etch masks that can be used include silicon nitride, photoresist, aluminum, or silicon carbide. Photolithography is used to pattern a resist, and then magnetron ion etching is used to transfer the pattern into the mask, FIG. 4 illustrating a simple patterned mask layer.

After the foregoing pattern transfer, the resist is removed and the patterned mask 12 serves as a mask for a deep vertical silicon trench etch. This step, preferably a reactive ion etching (RIE) process which uses a mixture of, e.g., chlorine and boron trichloride, etches the substrate 10 in the exposed regions around the mask 12 to produce corresponding trenches such as those illustrated at 14 and 16 in FIG. 5. The range of chlorine, $Cl_2$, is about 40–60 Standard Cubic Centimeters Per Minute (SCCM). A preferred concentration of $Cl_2$ is 48 SCCM. The range of boron trichloride, $Bcl_3$, is 2–15 sccm. The preferred concentration of $Bcl_3$ is preferably 2 SCCM. The trenches are defined by substantially vertical side walls such as the side walls 18 and 20 which define trench 16 and the side wall 22 which defines one side of trench 14. Generally horizontal floor surfaces 24 and 26 are formed in trenches 14 and 16 by this step. The ratio of the silicon etched depth to sidewall widening is typically 40 to 1 and etch selectivity (i.e., the ratio of the silicon etch rate to the mask etch rate) is typically 10:1 to 20:1. This allows formation of deep trenches defining mesas, such as the mesa 28 in FIG. 5, in any desired pattern as established by the mask 12.

After formation of the trenches, a conformal coating of a second mask such as PECVD oxide or other etch mask 30 is deposited to protect the side walls of the trenches during the subsequent release etch. Thereafter, the mask layer 30 is removed from the trench bottoms to expose floors 24 and 26, by means of an isotropic etch using, for example, $CF_4$ in a reactive ion etch (RIE). Thereafter, a second deep silicon trench etch using, for example, $Cl_2$ RIE deepens the trenches 14 and 16, as illustrated at 32 and 34, respectively, to expose the silicon substrate 10 below the protective mask layer 30 on the side walls. This exposes silicon sidewall portions 36 and 38 on opposite sides of the mesa 28 and side wall 40 on the substrate portion surrounding the trenches and mesas formed by the pattern 12.

The flow rate of $CF_4$ is in a range of 40–50 standard cubic centimeters per minute (SCCM), with $O_2$ being in a range from 2–5 SCCM. Alternatively, $CHF_3$ in a range of 40–50 SCCM may be used with $O_2$ having a range of 2 SCCM–5 SCCM. Other equivalent etchants may be used such as $CF_4$ having a range of 40–50 SCCM with $O_2$ having a range of 2 SCCM–5 SCCM and $H_2$ in a range of 2 SCCM–5 SCCM.

Figure 7:
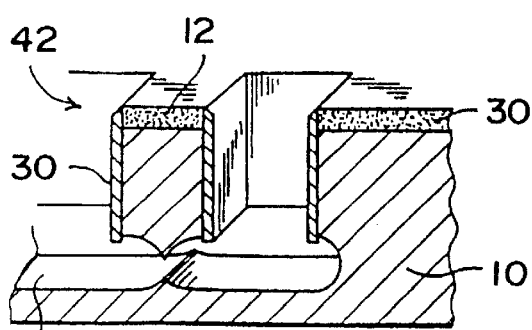

As illustrated in FIG. 7, the next step is to etch away the exposed silicon underneath the mask layer 30 to thereby release the mesa 28 to form a beam such as that illustrated at 42 in FIG. 7. This release step is carried out by means of an etch which releases the structure from the underlying substrate. Any method of etching may be used that results in enough removal of silicon to release mesa 28. Although this etch can be a wet-chemical etch in, e.g., aqueous KOH, etching is preferably performed using, e.g., $SF_6$ in a reactive ion etch (RIE). For RIE the etch is preferably performed using $SF_6$ in a range of 50–100 SCCM and $O_2$ having a range of 2 SCCM–10 SCCM. This etch step may be isotropic or anisotropic and is preferably isotropic. The beam 42 may be cantilevered from the side wall, as illustrated in FIG. 7, or may be supported by suitable posts extending from the floor 44 of the trenches upwardly to the beam.

Following the release step, a layer of aluminum 46 (FIG. 8) is applied, as by sputter deposition, to coat the side walls of the released beam and the adjacent substrate. This deposition also provides a coating 48 on the floor of the trenches which are beneath, and spaced from, the released beam. The undercutting effect of the release etch step, which is illustrated at 50 in FIG. 8, electrically isolates the layer 48 on the floor of the trenches from the side wall coating 46. Reactive-ion trench etching provides fingers having uniform surfaces, which allow the metal to form a conformal layer that can result in improved capacitance over prior-art accelerometers. The aluminum coating can be selectively etched to provide suitable electrical isolation so that the coating on the side walls of the beam and on the substrate can act as capacitor plates in the accelerometer. The silicon in the beam 42 serves as the mechanical support for the corresponding capacitor plate.

In typical integrated circuit wafers, in which the accelerometer of the present invention preferably is incorporated, contact pads are provided for use in connecting the accelerometer to surrounding circuitry. The contact pads are metal, typically aluminum, formed on an oxide insulating layer on the substrate top surface and covered by a protective oxide layer. The modified fabrication process of the present invention takes advantage of such contact pads for interconnecting the accelerometer to the circuitry on the substrate by interposing an additional masking and etching step prior to the sputter deposition step illustrated in FIG. 8. This additional masking step, which utilizes a resist layer and photolithography, locates the contact pads so that a subsequent etch step through the masking layer opens vias for the contact pad.

After the vias are opened, the sputter deposition step applies an aluminum layer which contacts the pads through the vias. Thereafter, another masking step is used to etch away undesired aluminum to thereby provide conductive paths from the sidewall capacitive plates to the contact pads on the surrounding substrate, and from there to the circuitry on the substrate for providing control potentials and for sensing the motion of the accelerometer.

Structure for a Microelectromechanical Accelerometer

A structure fabricated in accordance with the foregoing process is illustrated in simplified form in FIGS. 4–8, and includes only a single beam adjacent a nearby substrate. However, more complex structures can easily be fabricated using the process described above. An accelerometer of this invention in one embodiment comprises a mass that is at least partially freed from its substrate by etching, wherein at least a portion of the etching is performed using reactive-ion etching, and which mass is capacitively coupled to the substrate through fingers that are present on both the freed mass and the substrate. The fingers may be any shape that can capacitively couple with another shape. The fingers can be shaped like plates, being approximately rectangular or square. Alternatively, the fingers may comprise curved structures that face each other and whose capacitance changes as one of the fingers is rotated past or otherwise moved away from its corresponding finger. One of the advantages of using reactive ion etching for at least one of the etching steps is the ability to form such complex shapes and structures without regard to etch rates that vary along different crystal planes, as occurs in conventional micromachining methods.

The aspect ratio of a structure such as a beam, finger, or spring is the height of the structure (determined by the depth of the etch, where the structure is etched from a substrate) divided by the width of the structure (as viewed from overhead of the structure). The aspect ratio of an accelerometer according to an aspect of the invention is typically greater than about 4:1 and is preferably greater than about 6:1, and more preferably is greater than about 15:1. In contrast, the upper limit for surface micromachining etch processes is about 3:1.

The highest aspect ratio reported by a Cornell University group using a variant of this process is an aspect ratio of 100:1. This is a topic in U.S. patent application Ser. No. 08/383,524, filed Feb. 3, 1995, which is incorporated herein by reference.

It will be appreciated that the ability to form released structures with a high aspect ratio provides unique advantages over conventional accelerometers. A high aspect ratio sensing element or proof mass is substantially insensitive to transverse accelerations out of the axis of sensitivity. Such transverse acceleration otherwise could cause distortion of the proof mass and subsequent nonlinear effects. Accordingly, an accelerometer in accordance with this aspect of the invention can be used under conditions of simultaneous primary (in the axis of sensitivity) and transverse accelerations without loss of sensitivity.

A high aspect ratio released beam also enables an active motion transducing element, such as a transistor, to be fabricated on the released structure itself. This can minimize thermal and mechanical distortion of the measured response of the sensing element to an applied acceleration. This also minimizes impedance and substantially eliminates parasitic capacitance which can distort an accurate representation of an input acceleration. As a result, a much more sensitive detection of motion of the sensing element is possible.

An accelerometer of this invention also may use a spring to position the freed mass and substrate in their resting positions. Normally, one end of the spring is connected to the substrate and the other end is connected to the freed mass, although this particular arrangement is not necessary. Any means for positioning the freed mass and substrate in a desired configuration may be used. A positioner (such as a spring) formed by reactive ion etching can be designed to allow motion essentially in only the direction in which force is to be measured. Thus, a positioner formed by RIE may allow linear motion or rotational or torsional motion but essentially prevent other motions. The high aspect ratio of the structure creates stiffness and thus resistance to unwanted motion. Further, a positioner such as a spring formed by reactive-ion etching has the advantage that its dimensions are carefully controlled and are therefore highly accurate, so the spring constant is determined with greater accuracy than prior-art micromachining process could provide. These features are illustrated in the structures described below.

Figure 8:
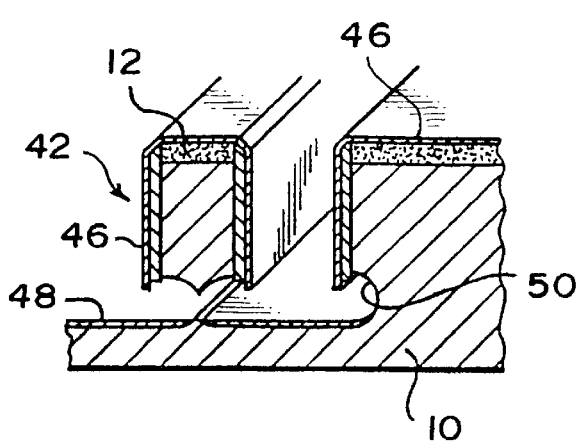
Figure 6:
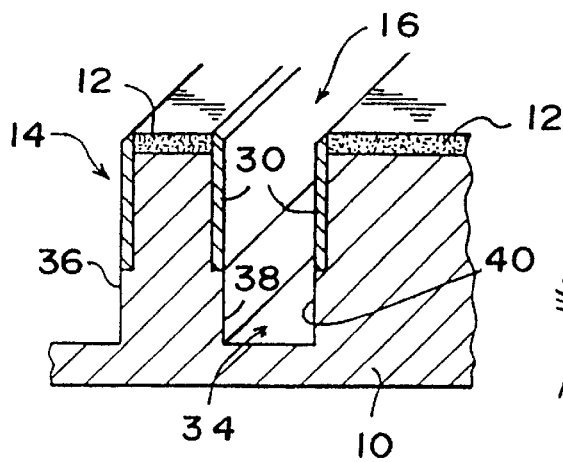
Figure 9:
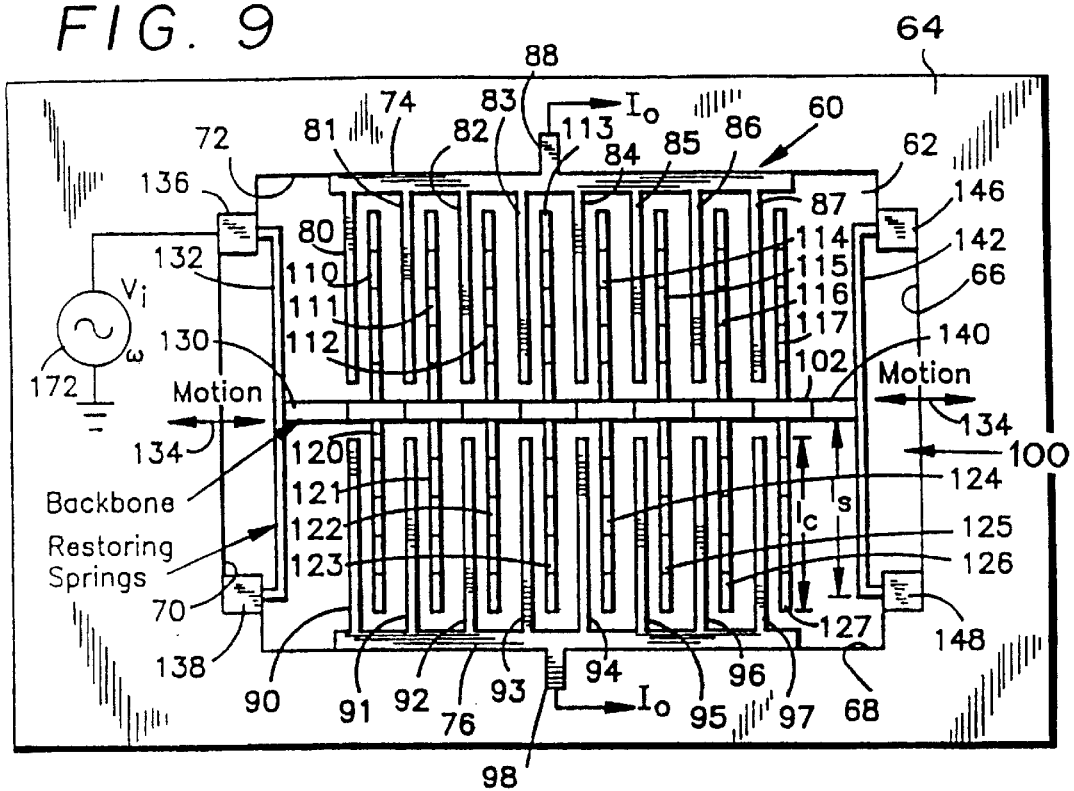
FIG. 9 is a diagrammatic top plan view of a preferred embodiment of the accelerometer structure of the present invention, which is made in or from a substrate such as single-crystal silicon.

One such structure made by a method of this invention is illustrated in the top plan view in FIG. 9, to which reference is now made. The first lithography step described above defines the complex structural features of the accelerometer of the present invention, generally indicated at 60, and these features are produced within a cavity 62 formed in substrate 64 during the trench etch steps described above. The process produces vertical side walls 66, 68, 70, and 72 for the cavity 62, with the surrounding substrate 64 providing the mechanical support for the fixed sensor portion of the accelerometer, as well as desired circuitry (not shown) for controlling and/or sensing the motion of the movable portion of the accelerometer. The sensor portion is connected to the side walls 68 and 72 of the cavity 62 and includes a pair of support beams 74 and 76, respectively, which are incorporated as a part of the side walls, or which may be cantilevered therefrom to extend inwardly into the cavity 62. Beam 74 is connected to a plurality of stationary fingers 80 through 87, which may be solid mesa structures extending upwardly from the floor of cavity 62, or may be cantilevered, released beams of the type illustrated in FIG. 8. Stationary fingers 80–87 extend perpendicularly to support beam 74, are parallel to each other, and their top surfaces lie in a common horizontal plane above the floor of cavity 62. Stationary fingers 80–87 include a layer of oxide so that the capacitive plates which they carry are electrically isolated from the substrate floor, and the fingers extend toward and terminate near an axial center line of the cavity 62. Stationary fingers 80 through 87 are fixed so that they are relatively stiff and inflexible, have a high aspect ratio, and, as illustrated in FIG. 8, are covered with a coating of electrically conductive material such as aluminum to form vertical capacitive plates. The aluminum coating also provides electrical connection between the side wall capacitive plates on each of the fingers 80–87 and an outlet connector pad 88, preferably located on the top surface of substrate 64 and insulated therefrom, as described above.

In similar manner, beam 76 is secured to wall 68 of cavity 62, preferably at a location diametrically opposite to the location of beam 74, with a plurality of laterally extending spaced fingers 90–97 extending inwardly from beam 76 toward the center axis of the cavity 62. As with fingers 80–87, the fingers 90–97 are parallel to each other, may be mesa structures extending upwardly from the cavity floor, or may be released from the floor so as to be cantilevered to the beam 76. The top surfaces of fingers 90–97 lie in the horizontal plane of fingers 80–87. Each of the fingers 90–97 is covered with a suitable insulating coating and a conductive coating such as aluminum, whereby the side walls of the beams form vertical capacitive plates. Again, the conductive coating on each of the fingers 90–97 is connected electrically to an output connector pad 98 on the top surface of substrate 64 by which an electrical connection can be made from the fixed capacitive plates to suitable external electrical circuitry which may be incorporated in the substrate wafer 64 or which may be external thereto.

The accelerometer 60 also includes a movable central mass portion generally indicated at 100 which can be fabricated at the same time the inwardly-extending stationary fingers 80–87 and 90–97 are fabricated. The movable portion 100 includes an axially-extending support beam 102 between the terminal ends of the fingers 80–87 and 90–97. Beam 102 serves as a backbone supporting a plurality of laterally outwardly extending fingers 110–117 which are interleaved with the inwardly extending fingers 80–87, and further includes outwardly extending fingers 120–127 interleaved with inwardly extending fixed fingers 90–97. Preferably, fingers 110–117 are laterally opposed to fingers 120–127 and lie in the horizontal plane of fingers 80–87 and 90–97, but it will be apparent that they can be relatively offset, if desired. The outwardly extending fingers are parallel to, and extend substantially the entire length of, the corresponding adjacent inwardly extending fingers, the terminal ends of the outwardly extending fingers terminating near, but just short of, the support beams 74 and 76.

Axial beam 102 and lateral fingers 110–117 and 120–127 may be fabricated in accordance with the process described above with respect to FIGS. 4–8, and thus are released from the underlying substrate 64 for free movement with respect thereto. The movable structure 100, consisting of the axial beam and lateral fingers, is suspended within cavity 62 by movable supports at opposite ends of the structure. Thus, the left-hand end 130, as viewed in FIG. 9, is secured to, or preferably is fabricated integrally with, a laterally extending spring support beam 132.

The support beam 132 is flexible in the plane of the accelerometer structure to permit axial motion of beam 102 in the direction of arrow 134. Support beam 132 is secured at its outermost ends to the substrate adjacent connector pads 136 and 138. The beam 132 serves as a restoring spring which tends to hold the beam 102, and thus the accelerometer moving structure 100, in a predetermined rest position with the opposed fixed and movable fingers spaced apart as required. The spring provides a predetermined resistance to motion, depending upon the dimensions and thus the flexibility of beam 132.

It will be appreciated that the support beam 132 can be made to have a desired length and predetermined cross section in order to provide a desired degree of sensitivity to an applied acceleration. The degree of spring flexibility, or lack thereof, is one of the determining factors (along with mass) of an accelerometer's range of operation and sensitivity. In accordance with this aspect of the invention, the ability to predetermine the cross section and response or resonant frequency of support beam 132 enables an accelerometer to be customized to have an optimal sensitivity for a specific application.

Beam 132 is fabricated in the manner described above with respect to FIGS. 4–8, and is released from the underlying substrate material in the cavity 62 for free motion above the floor of the cavity. The spring support beam is coated with an insulating layer and a conductive material such as aluminum so that it can be connected to external circuitry by way of connector pads 136 and 138, which are insulated from the underlying substrate 64.

In similar manner, the opposite end 140 of beam 102 is connected to a laterally extending spring support beam 142 which serves as a second spring for suspending the movable element 100 in its rest position and for allowing axial motion in the direction of arrows 134. The outermost ends of spring 142 are connected to the substrate 64 adjacent corresponding connector pads 146 and 148 which are insulated from the substrate and are provided with an aluminum or other conductive coating for electrical connection of the beam to suitable external circuitry.

Figure 10:
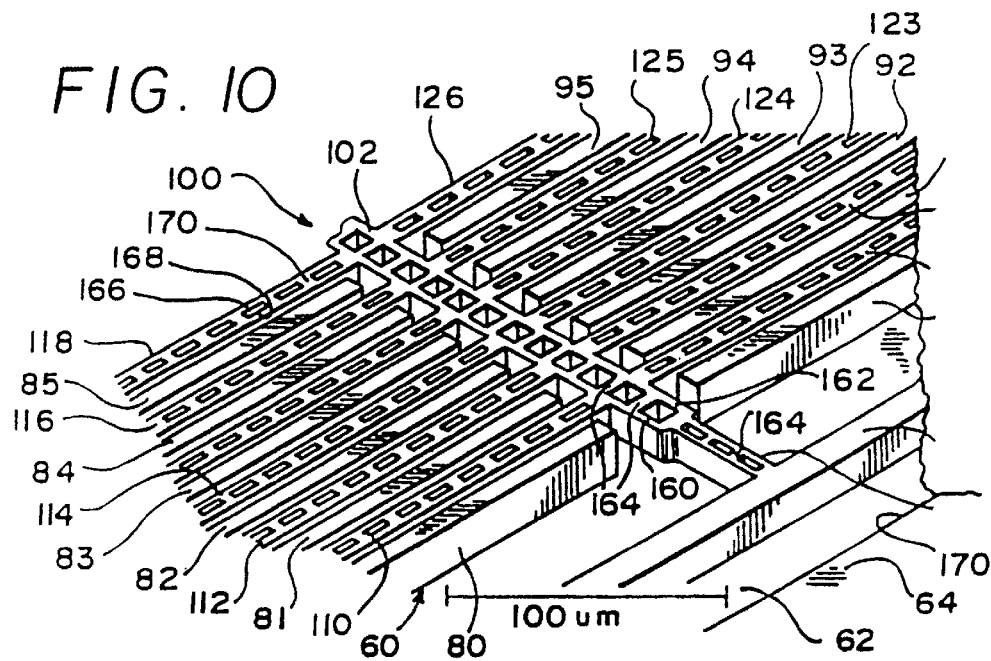
FIG. 10 is an enlarged perspective view of a portion of the structure of FIG. 9.

As is illustrated in FIG. 10, which is an expanded view of a portion of the device of FIG. 9, the movable assembly 100 of the accelerometer 60 can be a double beam structure to provide extra stiffness and strength to this part of the device. As illustrated, the axial support beam 102, or backbone, consists of two parallel longitudinal beams 160 and 162 joined by a multiplicity of interconnecting bridges 164 which serve as cross-braces. Similarly, each of the laterally extending fingers consists of a pair of parallel, closely-spaced beams such as the beams 166 and 168 illustrated for beam 118 and a multiplicity of cross braces, or bridges 170. This double-beam construction provides a high degree of stiffness for the moving element 100 so that the entire element moves unitarily under accelerating forces without flexure of the beam 102 or the fingers 110–117 or 120–127 to provide accurate measurements of the change of capacitance between opposed plates on the adjacent fixed and movable finger side walls.

Typically, in the microstructure of the present invention, each of the fixed fingers 80–87 and 90–97 is between about 5–15 $\mu$m in height depending on whether it is a mesa-type structure or is cantilevered, is about 4 $\mu$m in width, and may be 300 or more micrometers in length. If these fingers are cantilevered they preferably are spaced about 2 to 10 $\mu$m above the floor of the cavity 62. The spacing between adjacent fingers can be unequal where the acceleration is expected to be high in one direction, so that between adjacent fixed and movable fingers at rest, such as fingers 80 and 110, the spacing may be about 2 $\mu$m, while the distance between fingers 110 and 81 may be 8 $\mu$m. The individual beams making up the parallel sets of beams in the movable element 100 preferably will be somewhat thinner than the fixed beams and may be less than 1 $\mu$m in width, although the total width of the pair of beams for each movable finger may be somewhat greater than the width of a fixed finger. In one form of the invention, as many as 80 individual interleaved capacitor fingers may be provided.

The end return springs 132 and 142 may have the same general thickness and height and thus the same cross-section and aspect ratio as the released fingers. The two return springs are dimensioned to provide the resilience desired for holding the movable element 100 in place, while allowing quick and sensitive response to accelerating forces. The high aspect ratio of the springs insures that they will have greater flexibility in the axial direction indicated by arrows 134 and 144, than in the vertical direction, perpendicular to the common plane of the axial beam 102 and the lateral fingers 110–117 and 120–127. In one embodiment of the invention, the stiffness in the axial direction of beam 102 was 0.97 N/m while the out-of-plane stiffness, resulting from the high aspect ratio springs, was 128 N/m.

If desired, an additional masking step, following the process of FIGS. 4–8, can be used to remove the side wall oxide and metal films from the linear springs 132 and 142. Because the lateral spring constant (in the direction of arrows 134 and 144) varies with the cube of the beam width, the removal of the side wall films can reduce the lateral (in the direction of the axis of movement) spring constant by up to two orders of magnitude. A further control over the spring constant is obtained by varying the width of the spring beams by regulating the width of the silicon.

The capacitor plates on the side walls of the fixed fingers are connected to each other and to connectors 88 and 98, as noted above, while the capacitors formed on the side walls of the movable fingers are connected to each other and through the metal coating on the axial beam 102 and the metallized top surface of spring beam 132 to connector pad 136. The connectors 88, 98 and 136 are connected to suitable circuitry, which may include a source of potential 172, for example, which may be an alternating excitation source. When the structure is subjected to an accelerating force, the movable element 100 shifts with respect to the fixed fingers 80–87 and 90–97, the movable fingers each moving toward or away from the corresponding adjacent fixed fingers. This motion results in a variable capacitance which can be determined by measuring changes in the output voltage at connectors 88 and 98 to determine the displacement of the mass of the movable element 100.

The mass of the movable element 100 preferably is on the order of 1.0 nkg. If it is assumed that the frequency of the accelerating force is significantly lower than the natural frequency of the device, and that the lateral movable fingers and the axial beam 102 are orders of magnitude stiffer than the restoring springs 132 and 142, the change in separation between opposed plates on the fixed and movable fingers can be approximated with a simple spring-mass model and Newton's second law. From this a deformation of 13 mn for an acceleration of 9.8 m/s² can be expected, and since this deformation is small compared to the initial two-micron separation between the capacitor plates, the parallel plate approximation for the capacitance can be accurately expressed using the following equation:

$$C \cong \left(\frac{\epsilon_0 A}{d_0}\right)\left(1 - \frac{ma}{kd_0}\right) \quad \text{Eq. 1}$$

where m is the mass of the device, k is the lateral spring constant, A is the area of the plates, $d_o$ is the initial separation, and a is the acceleration. The capacitance may be measured by applying a 100 kHz, 155 mV carrier signal from source 172 through the device. The output current from the pads 88 and 98 is amplitude modulated by the change in capacitance caused by the applied acceleration. The magnitude of the peaks which represent the acceleration is as follows:

$$V_0 \cong \frac{1}{2}\omega_c C_0 V_i R_{tr}\left(\frac{ma}{k}\right)\left(\frac{1}{d_0}\right) \quad \text{Eq. 2}$$

where $V_i$ is the carrier amplitude, $R_{tr}$ is the transresistance, $C_o$ is the DC capacitance, $\omega_c$ is the carrier frequency, k is the spring constant, m is the mass of the device, and a is the acceleration. Experimental data show that the output voltage is linearly related to the acceleration.

Figure 12:
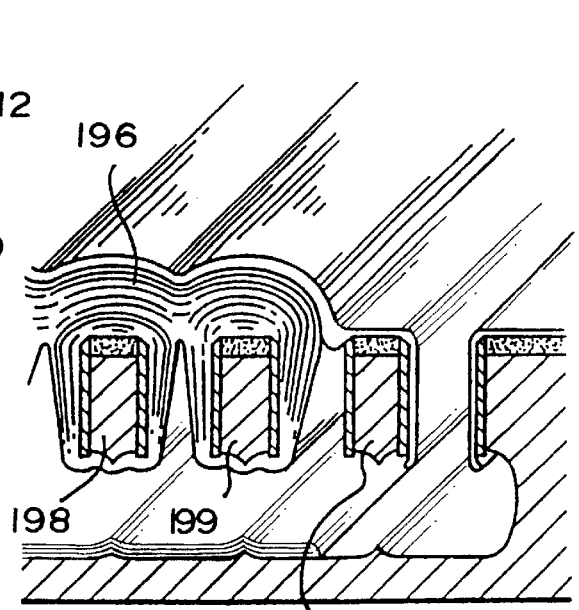
FIG. 12 is a diagrammatic cross-sectional view of a portion of the device of FIG. 11.
Figure 11:
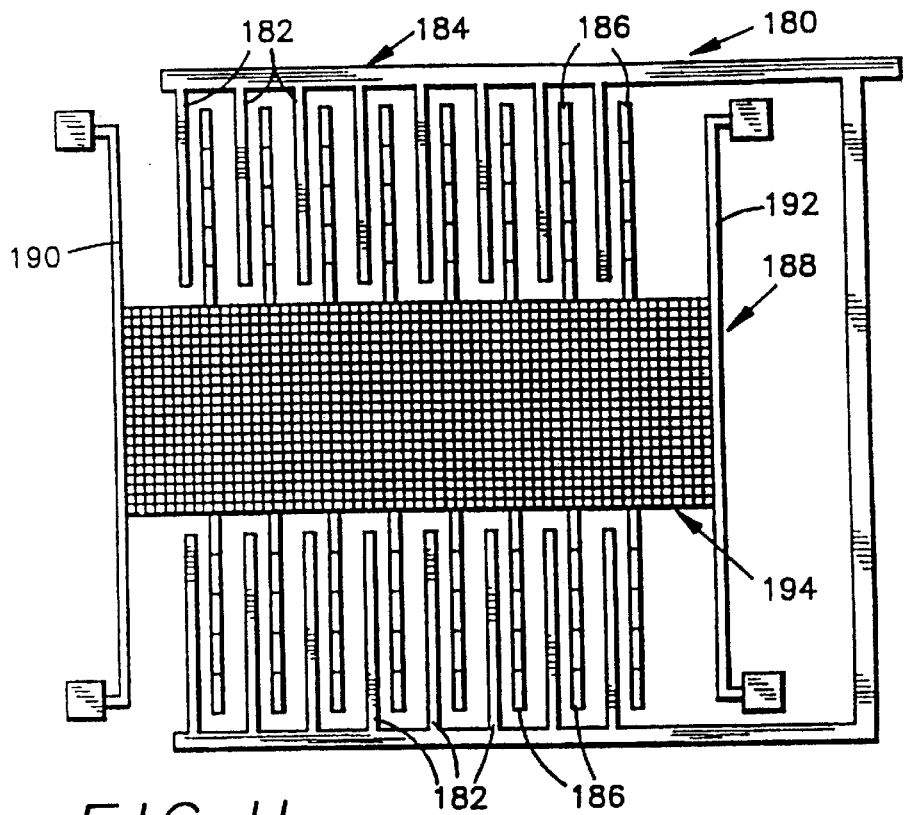
FIG. 11 is a diagrammatic top plan view of a second embodiment of the invention.

Additional mass can be provided for the moving structure 100, if desired, by enlarging the axial beam 102, as illustrated in FIG. 11. In the embodiment shown in FIG. 11, accelerometer 180 includes a plurality of fixed fingers 182 extending inwardly from a surrounding substrate, generally indicated at 184. The fingers 182 may extend from both sides of the device, the fingers lying in a common plane and being spaced apart to receive the movable fingers 186 of a movable element generally indicated at 188. The movable element is suspended at its opposite ends by linear springs 190 and 192, in the manner described with respect to FIG. 9, so that the movable fingers 186 lie in the plane of the stationary fingers 182 and are movable in that plane with respect to the stationary fingers. The additional mass is provided by a grid 194 which takes the place of the longitudinal beam 102 in the device of FIG. 9. This grid may be fabricated in the form of a plurality of individual longitudinal beams and lateral spacers, or may be in the form of a plurality of parallel beams covered by a layer of material such as tungsten in the manner illustrated in FIG. 12. A layer 196 of tungsten may be applied to a plurality of released beams 198, 199, 200, to provide an increased mass, the tungsten covering a selected portion of the grid formed by the underlying beams 198–200, for example, and filling in the inter-beam spaces to produce a thick conformal blanket. The size and thickness of the grid 194 or the layer 196 is selected to provide the mass required for the accelerometer function.

As illustrated in FIG. 11, in order to provide the additional mass required, it may be necessary to widen the spacing between the terminal ends of the fixed fingers on both sides of the accelerometer device. It will be understood that the exact dimensions will be selected in accordance with the sensitivity required for the forces that are to be measured.

The accelerometers illustrated in FIGS. 9, 10, and 11 are referred to as single-ended accelerometers, since motion of beam 102 in either direction along its axis causes the spacing between each of the movable fingers and its corresponding stationary finger to change in the same direction. It will be understood that the device could also sense motion in a vertical direction, toward and away from the floor of cavity 62, by changing the dimensions of the suspension springs 132 and 142 to allow vertical motion. In this case, the movable and fixed fingers would be equally spaced on both sides of each finger, by a distance of, for example, 2 μm.

FIG. 13 illustrates a modified version of the accelerometer which may be referred to as a differential, or double-ended device. As there illustrated, accelerometer 210 includes two stationary portions 212 and 214, both of which interface with corresponding laterally extending fingers forming part of a movable element 216. As illustrated, section 212 has laterally inwardly extending stationary fingers 218 and 220 extending inwardly from opposite sides of the accelerometer and spaced apart to receive interleaved movable fingers 222 and 224, respectively, which extend laterally outwardly from a central, axially extending support beam 226.

In similar manner, the section 214 includes rigid fingers 228 and 230 extending inwardly from opposite sides thereof and interleaved movable fingers 232 and 234 extending laterally outwardly from beam 226. Opposite ends of beam 226 are supported by linear springs 236 and 238, respectively, in the manner described above.

The stationary fingers 218 and 220 are connected to a first outlet connector pad 240 while stationary fingers 228 and 230 are connected to a second outlet connector pad 242. The movable structure 216 is connected to a single voltage supply pad 244.

The movable fingers in section 212 of the accelerometer are on the right-hand side of their corresponding stationary fingers (as viewed in the Fig.) while the movable fingers in section 214 are mounted on the left-hand side of their corresponding fingers 228. Accordingly, motion of the movable element 216 to the left, as viewed in the Fig., causes fingers 218 and 222 to move closer together, while at the same time causing fingers 228 and 232 to move further apart. This provides a differential or change in capacitance between the respective plates, and provides a differential voltage change at pads 240 and 242 so as to increase the overall sensitivity of the accelerometer for a given amount of longitudinal motion.

As indicated above, the sensitivity of the accelerometer can be selected by properly dimensioning the thickness, height and length of the suspension springs at the ends of the movable element. It will be recognized that once fabricated, the mechanical structure will have a fixed natural, or resonant, frequency and a response bandwidth which is limited by the natural frequency of that structure. Thus, the range of input frequencies that the sensor can accurately measure is limited by its mechanical structure. However, in accordance with a further feature of the present invention, a control structure is provided for electrically or electromechanically varying the stiffness of the restoring springs. This advantageously achieves precise control of the resonant frequency of the device and increases the range of frequencies that the sensor can accurately measure.

Figure 14:
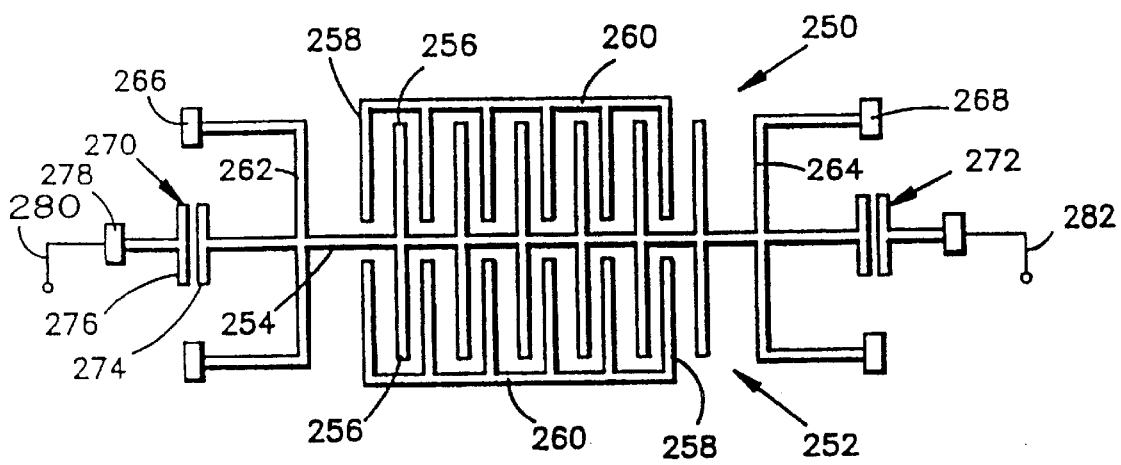
FIG. 14 is a diagrammatic top plan view of a fourth embodiment of the invention, illustrating a control for a restoring spring structure.

One structure for varying the stiffness of the spring and thus the resonant frequency of the accelerometer is illustrated in FIGS. 14 and 15. As there illustrated, an accelerometer 250 includes a movable element 252 having an axial support beam 254 carrying a plurality of laterally outwardly extending fingers 256. As discussed above, the fingers 256 are interleaved with inwardly extending stationary fingers 258 mounted as cantilevers on a substrate 260. The support beam 254 is mounted at its opposite ends to laterally extending linear restoring springs 262 and 264, both of which are connected at their outer ends to a fixed support adjacent connector pads such as the pads 266 and 268.

Control of the flexibility of springs 262 and 264, and thus of the resonant frequency of the structure, is provided by a pair of capacitive drivers 270 and 272, respectively. Driver 270 is illustrated as including a first plate 274 fixed to the return spring 262 and a second, spaced plate 276 fixedly mounted to a support pad 278. The driver is electrically connected by way of pad 278 and a connector line 280 to a suitable source of control voltage. By varying the voltage applied to line 280, the potential across plates 274 and 276 can be varied, thereby controlling the force between these plates and thereby regulating the accelerating force required to enable the movable support beam 254 to move plate 274 with respect to plate 276. Since that motion is due to the accelerating forces applied to the accelerometer, the voltage applied to line 280 controls the effective stiffness of the spring and thus the sensitivity of the accelerometer. In similar manner, a voltage applied by way of line 282 to capacitor 272 controls the stiffness of spring 264.

The voltages applied to the two drivers 270 and 272 can be used to reduce the stiffness of the springs 262 and 264 by selecting the voltages to oppose each other so that a force is applied to one of the drivers to move spring 262 to the left, and a force is applied to the other capacitor to move spring 264 to the right. If an accelerating force initiates motion of the structure toward the left, for example (see FIG. 15), the capacitance of capacitor 270 will increase and that of capacitor 272 will decrease. As a result, the new force on the element 252 due to the voltage applied to capacitors 270 and 272 will be towards the left, and this will aid the accelerating force, thereby producing a net reduction in the external force required to shift the movable fingers 256 with respect to the stationary fingers 258. This increases the sensitivity of the device and decreases the natural frequency.

Although drivers 270 and 272 are illustrated as parallel plate capacitors, it will be understood that comb-type capacitors can also be substituted for the plate-type capacitors to control the motion of the springs.

An increase in the stiffness of the support springs can be obtained in the manner illustrated in FIG. 16 wherein an accelerometer 290 includes a movable element 292 having laterally outwardly extending fingers 294 extending from a central, axially extending support beam 296. Beam 296 is connected at its opposite ends to laterally extending linear suspension springs 298 and 300 which are fixed at their outer ends and which are flexible to permit longitudinal motion of beam 296 and corresponding motion of the fingers 294 with respect to stationary interleaved fingers (not shown). To increase the stiffness of the springs 298 and 300, a pair of control capacitors 302 and 304 are provided. In this embodiment, capacitor 302 includes a first comb-shaped plate 306 connected to the movable element 292 and a second, opposed comb-shaped plate 308 connected to a fixed pad 310 on the substrate in which the accelerometer is mounted. Capacitor 304 is similarly constructed.

A force applied to the accelerometer 290 to cause the movable element 292 to shift towards the left (as viewed in FIG. 16) will cause plate 306 to shift towards the left with respect to the fixed plate 308. A voltage applied across those plates will tend to restore the plate 306 to its rest position (illustrated in the Fig.). The greater the accelerating force applied to the movable element 292, the greater the displacement of plate 306 with respect to plate 308. By controlling the voltage applied across the plates the restoring force can be controlled to provide the desired effective stiffness for the springs 298 and 300. The minimum voltage required to hold the movable element 292 in place is a measure of the accelerating force applied to that element.

Figure 17:
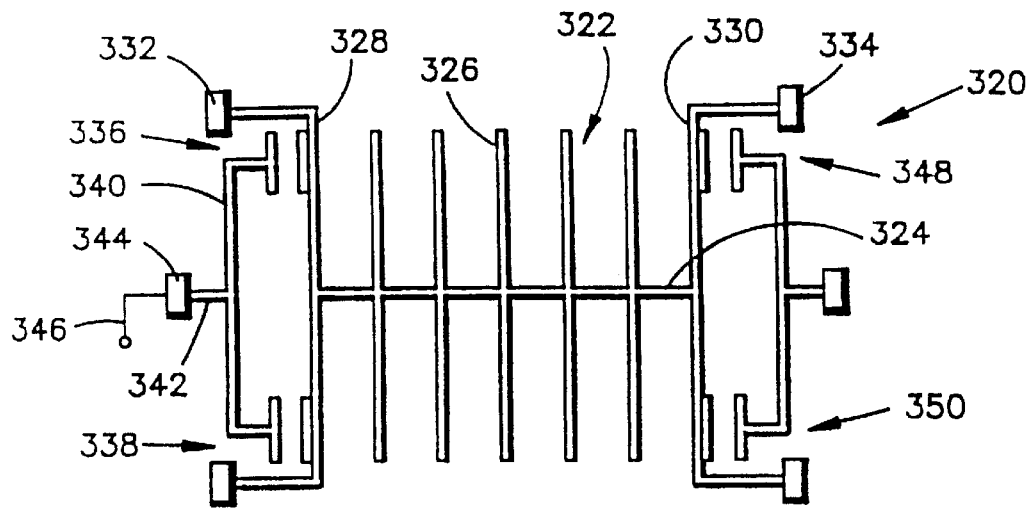
FIG. 17 is a diagrammatic top plan view of a sixth embodiment of the invention, illustrating another modified control structure.
Figure 18:
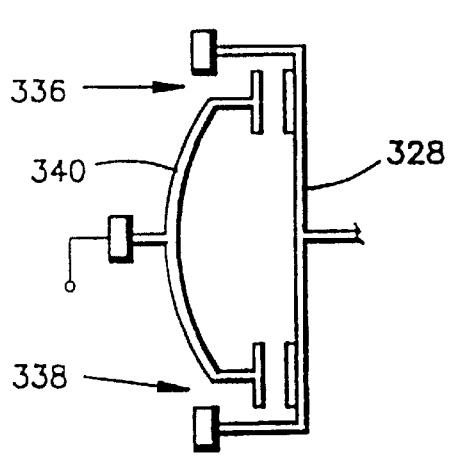
FIG. 18 is a diagrammatic partial top plan view of the embodiment of FIG. 17, with the control activated.

FIGS. 17 and 18 illustrate an electromechanical method for increasing the stiffness of the return springs for the accelerometer. As there illustrated, the accelerometer 320 includes a movable portion 322 having, as before, an axial support beam 324 and a plurality of laterally outwardly extending fingers 326. The opposite ends of the beam 324 are supported by laterally extending linear suspension springs 328 and 330 which are supported at their outermost ends on fixed pads such as the pads 332 and 334. Adjacent each of the springs 328 and 330 is a pair of clamping capacitors such as the capacitors 336 and 338 adjacent spring 328. These two capacitors are mounted on a flexible support beam 340 which is, in turn, mounted at its center by way of arm 342 to a fixed pad 344. A voltage may be applied to the two capacitors 336 and 338 by way of an input line 346 and electrically conductive coatings on pad 344 and beams 340 and 342. An application of a suitable voltage draws the plates of capacitors 336 and 338 together, as illustrated in FIG. 18, thereby bending the support beam 340 and effectively connecting beams 340 and 328 in parallel to thereby mechanically change the flexibility of beam 328. In similar manner, the flexibility of beam 330 can be changed by the application of a voltage to capacitors 348 and 350 which are constructed in a manner similar to that of capacitors 336 and 338. After the capacitors for both beams 328 and 330 are clamped, the system becomes stiffer and the natural frequency increases, with a consequent decrease in sensitivity. It will be understood that a layer of insulation will be included between the plates of the clamping capacitors and the restoring springs 328 and 330 to prevent sticking and to prevent short circuits.

Figure 19:
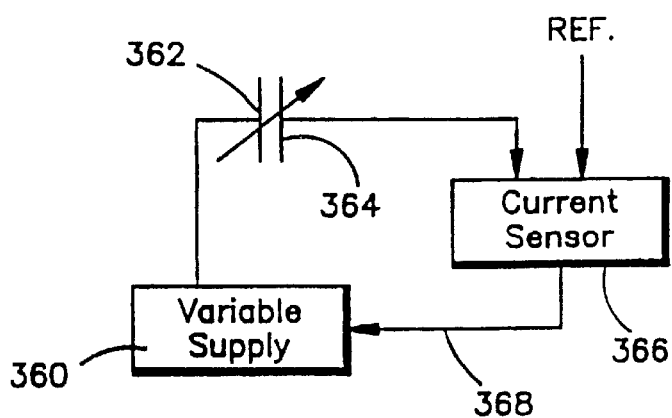
FIG. 19 is a diagrammatic illustration of a feedback control system for the present invention.

In each of the embodiments illustrated herein, an active feedback system may be incorporated to measure the capacitance between the plates on the fixed and movable fingers caused by relative motion of the plates and to provide a feedback voltage that can be applied to restore the movable fingers to their rest position. The feedback voltage is a measure of the applied force. In such a system, the change in capacitance due to the applied force is measured by the current flow through the plates, for example, and this value is used to adjust the voltage applied to the movable element to thereby hold the movable element at its rest position with respect to the fixed structure. The feedback voltage varies instantaneously with changes in the applied force, so the movable element does not move, with the result that errors due to nonlinearities caused by relative motion of the parts is eliminated, and the accuracy and sensitivity of the system is increased. Such a feedback system is illustrated diagrammatically in FIG. 19 where a variable voltage supply 360 supplies potential to the movable plates 362 of the accelerometer. The current flow between the variable plates 362 and the stationary plates 364 is measured by a current sensor 366 and compared to a reference value. A difference signal is applied by way of line 368 to regulate the variable supply 360 to maintain a predetermined spacing between the fixed and movable plates. The value of the signal 368 may be used to determine the value of the accelerating force applied to the movable plates 362. Such a system can be used, for example, to provide a feedback voltage to maintain the alignment of capacitor plates 306 and 308 in FIG. 16, or to control the voltages applied to capacitors 270 and 272 in FIG. 14.

Although the foregoing discussion has been directed to variations of capacitance caused by motion of the movable element; for example, element 100 in FIG. 9, in the plane of the capacitor plates, it will be understood that motion perpendicular to that plane can also be measured, since there is a capacitance between the capacitor plates carried by the moving fingers and the underlying substrate or a metal layer or that substrate. This is illustrated in FIG. 8, where metal layer 48 can serve as a ground plate with respect to the metal layer 46 on the beam 42. The capacitance between these metal layers can be used to detect motion perpendicular to the plane of the fingers so that the accelerometer is three dimensional. Although the layer 48 is shown as being on the semiconductive substrate 10, it will be understood that an insulating layer can be provided on the floor of the trenches before the metal layer is applied so as to insulate layer 48 from the underlying substrate.

The fabrication process described above can also be used for making a torsional accelerometer such as that illustrated in FIG. 20. In the embodiment there illustrated, a movable element, or beam, 380 is located within a cavity 382 in the substrate, and is mounted for rotational motion about the axis 383 of a shaft 384. As illustrated in FIG. 21, shaft 384 extends across the cavity 382 to mount the movable element 380 on the side walls 386 and 388 defining the cavity, which is formed within substrate 390. As most clearly seen in FIG. 20, the movable element 380 may be fabricated to be asymmetrical with respect to the shaft 384 so that the left hand side, as viewed in FIGS. 20 and 21, of the movable element is more massive than the right hand side. This uneven distribution of mass causes the movable element 380 to twist around the axis of shaft 384 when the movable element is subject to a vertical motion in the direction of arrows 392.

The twisting motion produced by rotation of the movable element 380 about the axis of shaft 384 is resisted by the spring action of the shaft which tends to restore element 380 to its neutral horizontal position. Motion of element 380 may be detected by corresponding capacitor plates located on the movable device and on the surrounding substrate, as previously discussed. Thus, for example, a conductive layer 394 on the movable element 380 may be used to form a common plate for each of a pair of motion sensing capacitors. The plate 394 may be connected to external circuitry by way of metallic layer 396 on the shaft 384 leading, for example, to a connector pad 398 on the surface of the substrate. As illustrated in FIG. 20, the plate 394 extends vertically down the sides of the movable element 380, at 400 and 402 on the left and right vertical walls, respectively, of element 380.

The vertical walls 400 and 402 form movable capacitor plates which are adjacent corresponding spaced stationary plates 404 and 406, respectively, to form sensing capacitors 408 and 409. Electrode plate 404 is formed on the top of substrate 390 and extends over the side wall 411 of the cavity. In similar manner, the electrode 406 is located on the surface of the substrate and extends over the side wall 411 of the cavity so that motion of the movable element 380 shifts capacitor element 400 with respect to corresponding element 404 and shifts element 402 with respect to corresponding element 406. The relative motion of the plates changes the capacitance of both capacitor 408 and capacitor 409, and these changes can be detected by suitable circuitry connected to the various capacitor plates by way of the electrodes on the surface of the substrate. The element 380 and the capacitors 408 and 409 form a sensitive accelerometer capable of measuring small changes in capacitance to provide a sensitive measurement of vertical motion or acceleration.

It will be understood that the movable element 380 may be fabricated to be symmetrical with the shaft 384 so that the mass on each side of the shaft is the same. In this situation, vertical motion or acceleration of the device in the direction of arrows 392 will result in bending of the shaft 384 in a vertical direction, rather than rotation. However, this motion can also be measured by the capacitors, as discussed above.

Through conventional masking techniques, material can be added to the movable element 380 on one side or the other of the axis of shaft 384 to adjust the torsional forces exerted upon the element as a result of vertical motion of the substrate. The material added can be tungsten, for example, added to the top surface of the element 380 through a mask to change the balance of the element 380 and thus to change the characteristics of the accelerometer.

It will be understood that rotational, or torsional, motion imposed on the substrate 390 for example, motion about the axis of shaft 384, can also be measured by the device of FIGS. 20 and 21. Thus, rotation of the substrate 390 in a clockwise direction about the shaft 384 will result in relative motion between the plates 400 and 404 and between plates 402 and 406 to produce a change in capacitance which can be measured, as discussed above.

Torsional motion also can be measured by the device illustrated in FIGS. 22 and 23, wherein a central, elongated support beam, or arm is mounted on a vertical shaft for rotational motion in a horizontal plane about the axis of the vertical shaft. As shown in these FIGS. 22 and 23, a substrate 420 incorporates a cavity 422, which in this case is illustrated as being circular, with a vertical post, or shaft, 424 extending upwardly from the floor 426 of the cavity. Fabricated on the top end of the shaft is an accelerometer sensor element 428, which in this case is in the shape of an elongated beam, or arm 429 extending across the cavity and movable in a horizontal plane perpendicular to the axis of shaft 424. The arm 429 terminates at a pair of laterally extending, arcuate fingers 430 and 432 unitarily formed with the arm 429. The fingers 430 and 432 act as inertial weights for the movable arm 429 so that when a rotational, or torsional force having a component in the imposed on the substrate 420, for example in the direction of arrows 434, the inertia of lateral fingers 430 and 432 will produce a twisting motion about the axis of shaft 424 which is resisted by the spring action of the shaft. The length and thickness of the fingers 430 and 432, as well as the length and thickness of arm 429, including an enlarged hub portion 436, determine the sensitivity of the device to torsional forces.

As noted above with respect to FIG. 20, the device may be modified to change the sensitivity of the device and the applied accelerometer force to which the sensor element responds by adding an additional metal layer to the arm 429 as well as to the fingers 430 and 432, the use of suitable masks permitting accurate control of the placement of such additional material. The shaft 424 acts as a flexible restoring spring for the sensor element 428, urging the element toward its normal rest position.

To sense the relative motion of the arm 429 with respect to the substrate 420, four pairs of capacitor plates are provided, plates 438 and 440 and plates 442 and 444 being positioned on opposite sides of corresponding ends of lateral finger 430, and plates 446 and 448 and 450 and 452 being positioned on opposite sides of corresponding ends of lateral finger 432. The capacitor plates, in the illustrated embodiment, are arcuate and spaced sufficiently apart to permit motion of the arcuate fingers 430 and 432 between the respective pairs of plates, with the plates themselves preferably being concentric with the axis of shaft 424.

Rotational motion of the arm 429 with respect to the substrate 420 causes each of the fingers 430 and 432 to move further between one of its associated pair of capacitor plates and to move out of the other of its associated pair of capacitor plates to differentially change the capacitance measured by each pair. This permits a highly sensitive measurement of capacitance changes upon the application of rotational forces, thereby providing a very sensitive torsional accelerometer.

The stationary plates for the capacitor pairs are connected to external circuitry through suitable conductive strips on the substrate, as previously discussed. Thus, for example, the stationary plates 438 and 442 are connected to a conductive strip, or layer, 460 while plates 446 and 450 are connected to conductive strip 462 on the top surface of substrate 420. Stationary capacitive plates 440 and 448 are connected to conductive strip 464 and plates 444 and 452 are connected to conductive strip 466, respectively. Strips 464 and 466 extend along the floor 426 of the cavity 422, up respective side walls of the cavity and across the surface of the substrate. It will be understood that other arrangements of the conductive strips may be provided, as desired. Movement of the fingers 430 and 432 between the pairs of capacitive plates changes the capacitance therebetween and such changes are detectable by suitable circuitry (not shown) connected to the conductive strips. Although the plates 438, 442, 446, and 450 are illustrated as being fabricated on the side wall of cavity 422, it will be understood that they may be free standing, or may consist simply of a conductive layer of metal formed on the surface of the cavity wall.

Figure 24:
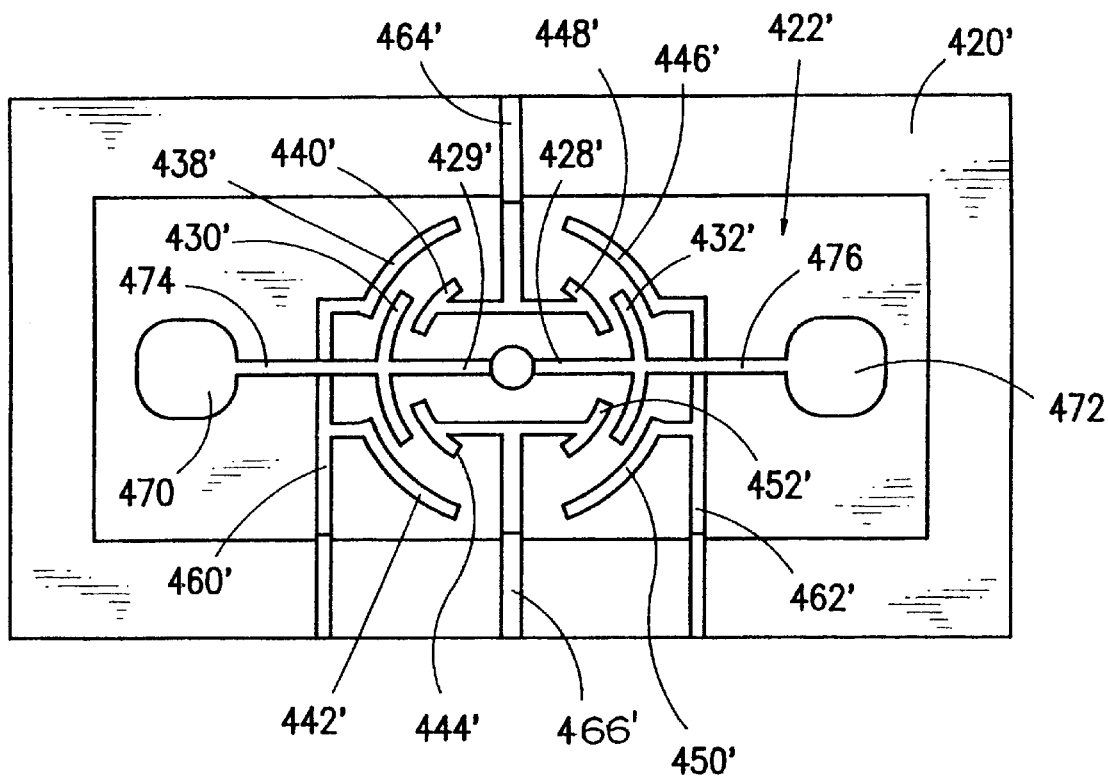
FIG. 24 is a top plan view of a modification of the embodiment of FIG. 22.

Free standing capacitor plates are illustrated in FIG. 24, which illustrates an embodiment of the invention wherein the cavity 422' in substrate 420' is enlarged to receive extensions of the movable arm 429'. In the embodiment of FIG. 24, elements in common with the device of FIG. 22 are illustrated by prime numbers. Thus, free standing capacitor plates 438' and 442' are connected to a conductor 460', plates 440' and 448' are connected to conductor 464', plates 446' and 450' are connected to conductor 462', and plates 444' and 452' are connected to conductor 466', the conductors leading to suitable external circuitry (not shown) as previously discussed. In this case, however, the strips 460' and 462' may be located on the cavity floor instead of on the top surface of the substrate.

In the embodiment of FIG. 24, the movable element 428' includes a pair of extension weights 470 and 472 mounted by way of extension arms 474 and 476, respectively, to opposite ends of movable arm 429. The weights 470 and 472 are enlarged masses which provide greater inertia to the movable element 428 to increase the sensitivity of the device to torsional or rotational forces, thereby providing a more sensitive torsional accelerometer. The weights 470 and 472 are fabricated from the substrate material in the manner described above, and may be covered by metal to a thickness sufficient to provide the desired mass, and thus the desired sensitivity, for the device.

Accelerometer Uses

Accelerometers of this invention may be used in vehicles such as cars, buses, and trucks to deploy airbags and control suspension movement, steering, and braking and as part of an inertial navigation system. Equivalent accelerometers also may be used in vehicles such as aircraft, ships, and submarines to measure acceleration in different directions and to control the movement of those craft or the deployment of safety devices such as airbags or the anti-blackout device used by pilots. While these different uses may require accelerometers of differing design and response characteristics, such accelerometers nevertheless could be constructed incorporating the aspects of the present invention.

For example, a micromechanical accelerometer used to deploy an airbag typically will have moving parts of relatively high mass and/or springs having large spring constants. The accelerometer is usually attached to signal-conditioning electronics to convert either a voltage change associated with change in capacitance, or a change in current required to maintain constant voltage into a signal that indicates the measured acceleration. The output signal can be, for example, a voltage, a frequency, or a signal amplitude that varies with acceleration. The output signal also can be a signal that indicates that a preset acceleration has been met or exceeded. The output signal is used by other electronics to deploy the airbag when an acceleration of a certain magnitude is measured in a specified direction. Examples of these systems are disclosed in U.S. Pat. Nos. 5,436,838 and 5,411,289, which are incorporated herein by reference in their entirety.

An accelerometer used to measure pitch or yaw or vehicle suspension movement will typically have moving parts of low mass and springs with small spring constants. The accelerometer is connected to signal conditioning circuitry in a well known manner as discussed above, and the signal is sent to a read-out device or to other components that control the suspension of the vehicle. These accelerometers also can be used in steering systems, for example, to measure the lateral acceleration of a vehicle due to wind and to control the steering in order to correct for the wind forces, or to provide a variable steering system. Examples of these systems are disclosed in U.S. Pat. Nos. 5,348,111, 5,295,074, Re. 34,628, and 4,625,993, which are incorporated herein by reference.

Similarly, an accelerometer of this invention may be used to measure the acceleration of a vehicle, and differences in acceleration may be used to control the power applied to the wheel (in the case of traction control) or the braking force applied to a particular wheel (in the case of traction control or anti-lock braking). Examples of these systems are disclosed in U.S. Pat. Nos. 5,454,630, 5,315,518 and 5,275,474, which are incorporated herein by reference.

An accelerometer of this invention can be fabricated in the same substrate as electronic components that are used to process the signal from the accelerometer or other electronic components that are to be placed on the same substrate. For example, an accelerometer, optional signal-conditioning electronics, and such VLSI circuitry as airbag-deployment electronics all may be supplied as an integrated unit by fabricating all of these components on one substrate. This method of manufacturing provides smaller electronic packages having greater reliability and consistency than can be provided by conventional capacitive accelerometers. The electronics associated with the accelerometer may be completely fabricated before the substrate is etched to form an accelerometer. A mask protects the electronics from etching when forming the accelerometer.

Alternatively, the electronics associated with the accelerometer may be fabricated after the substrate is etched to form an accelerometer. A mask then protects the accelerometer when etching or otherwise forming the electronic components. However, the metal deposition for the accelerometer would have to be done after the initial high temperature steps for the electronics fabrication.

Reactive-ion etching allows fabrication of other micromechanical structures from the same substrate as electronic components and/or an accelerometer are fabricated. The combination of low reaction temperatures and use of masks protects the micromechanical structure and/or electronics being formed from other processing steps that would damage the particular component being formed, if low temperature or a mask were not being used. The micromechanical structure is one that can be at least partially etched using reactive-ion etching and which is not rendered inoperative for its intended function because of process steps required to form other components to be present on the same substrate.

Summary of Advantages of Accelerometers of This Invention

Plasma or reactive ion etching offers a solution to the limitations of bulk and surface micromachining for many commercially important applications. See, for example, Z. Lisa Zhang and Noel C. MacDonald, "A RIE Process For Submicron, Silicon Electromechanical Structures," *J. Micromech. Microeng.* 2 (1992), pp. 31–38; See also, Kevin A. Shaw, Z. Lisa Zhang and Noel C. MacDonald, "SCREAM I: A Single Mask, Single-Crystal Silicon, Reactive Ion Etching Process For Microelectromechanical Structures," *Sensors And Actuators,* 40 (1994), pp. 63–70; U.S. Pat. Nos. 5,198,390, 5,316,979 and 5,393,375, which are incorporated herein by reference; and U.S. patent application Ser. No. 08/312,797 filed Sep. 27, 1994, entitled "Microstructures and Single Mask, Single-Crystal Process for Fabrication Thereof" and U.S. patent application Ser. No. 08/383,524, filed Apr. 11, 1995, entitled "Masking Process For Fabricating Ultra-High Aspect Ratio, Wafer-Free Micro-Opto-Electromechanical Structures," all of which are incorporated herein by reference in their entirety. The following table summarizes strengths and weaknesses of the different fabrication technologies discussed above.

According to an aspect of the invention, reactive-ion or plasma etching, using dry etching techniques, provides a number of advantages over conventional methods for fabricating structures for a microelectrochemical accelerometer.

The mechanical structures can be formed in or from single crystal silicon or other substrate and in or from a single wafer. The use of single crystal silicon eliminates grain boundaries and provides uniform mechanical characteristics and enables resonant frequency to be closely controlled. The use of a single crystal silicon released structure also provides an improved sensing element. Active signal conditioning circuitry such as transistors also can be formed directly in the beams or released structures comprised of single crystal silicon which form the sensing elements. This substantially eliminates nonlinearity or inaccuracies in measurement due to parasitic capacitance and thermal or mechanical strain.

The height of structures is controlled by the depth of the plasma etch into the silicon, rather than by implantation of an impurity into the silicon or by depositing or bonding an additional structural layer on the substrate. This enables very thick released structures to be created with high aspect ratios, on an order of 6:1 up to 100:1 or greater. Such high aspect ratio sensing elements are characterized by high stability and insensitivity to undesirable transverse acceleration. High aspect ratio released structures also provide greatly increased capacitance for sensing smaller acceleration vectors.

TABLE 1

| MEMS Fabrication Technology | Description | Possible Device Geometries | Mechanical Material | Mechanical Structure Aspect-Ratio | Process Integration with Micro-electronics |
|---|---|---|---|---|---|
| Bulk micro-machining | Anisotropic chemical etchant (e.g. KOH) is used to define structures bounded by certain crystal planes. Wafer bonding or ion implantation is often used to form etch stops. | very limited shapes; a function of the crystal planes | single crystal silicon | typically low; special cases can be very high | poor |
| Surface micro-machining | Poly-crystalline silicon is deposited on a sacrificial layer of silicon dioxide. Mechanical structures are formed in the polysilicon and then the sacrificial layer is etched away to release them. | arbitrary shapes but limited in vertical height | polysilicon | low | fair |
| Plasma or reactive ion etching | A sequence of anisotropic and isotropic reactive ion etches is used to fabricate released mechanical micro-structures in single crystal silicon. | arbitrary | single crystal silicon | high | excellent |

Reactive-ion etching eliminates the problem of inherent stress in the mechanical structures, as is present in, e.g., polycrystalline silicon, since the mechanical structures can be formed from initially stress-free bulk silicon. Thus, an accelerometer made by this process can achieve greatly improved sensitivity and an enhanced response to smaller acceleration vectors. This would enable an accelerometer made in accordance with this aspect of the invention to be useful in a range of 0.1 to 1 g.

Another important advantage of the invention is that the geometry of the accelerometer can be determined independently of crystal orientation, thereby enabling complex shapes and structures to be made.

The entire accelerometer fabrication process of the present invention is compatible with and scalable with conventional VLSI integrated circuit processes. This enables fabrication of signal conditioning circuitry or other devices on the same silicon wafer or chip from which the micromechanical sensing device is fabricated.

As a result of the foregoing and other advantages, accelerometers of this invention, particularly those made with reactive ion etching, are capable of high accuracy and can be produced precisely with repeatable dimensions and in high yields with commensurate low per unit costs as required by automotive accelerometer applications. Furthermore, accelerometers of this invention can achieve superior device performance such as high linearity, high capacitance, and excellent phase-response to accelerations because of the variety of geometries made possible by reactive-ion etching, the light mass and high stiffness of the accelerometer, and the improved metal layer conformation to the capacitively-coupled areas of the accelerometer.

A wet-chemical micromachining etch of the prior art would not be capable of making structures such as those illustrated in FIGS. 20 and 22 with accuracy and repeatability of dimensions. As noted above, wet-chemical etching is dependent on orienting the structure along certain crystal planes and timing the etch. Etching occurs at different rates along different crystal planes.

Obtaining complex structures such as those shown in FIGS. 20 and 22 requires unusually-shaped etch masks and silicon crystals free of crystal-plane defects, as well as precise control of etch conditions and time. Silicon crystals often have crystal-plane defects, and etch conditions and time vary within the processing and control limits of the equipment used. Wet-chemical etching cannot make complex structures such as those shown in the figures accurately and repeatably because of the inherent limitations in the wet-chemical etching process.

Improved accelerometer performance results in part from the high aspect-ratio mechanical structures which can be provided. The high aspect ratios of the capacitively-coupled fingers helps to provide large surface areas. Prior-art micromachining is limited to making plates having an aspect ratio of approximately 5:1 or less, because, among other reasons, prior-art micromachining utilizes wet-chemical etching that is highly dependent upon orienting the structure to be etched along a particular crystal plane. This also depends upon precise timing of an etch to prevent over-etching the length, width, and height of the plates.

The non-uniform etching that is prevalent in wet-chemical etching also limits the aspect ratio and length of fingers, since localized over-etching as occurs in wet-chemical etching creates weak, delicate areas that break easily. Reactive-ion etching permits fabricating fingers or a sense element having an aspect ratio greater than about 4:1, preferably greater than about 6:1, and more preferably, greater than about 15:1.

Figure 25:
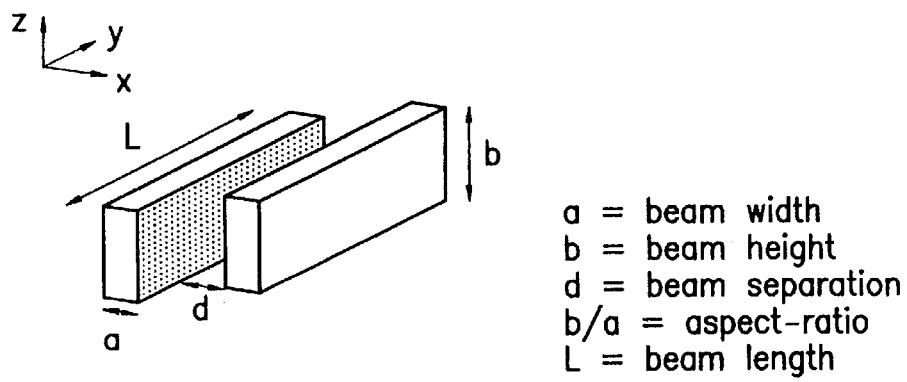
FIG. 25 is a diagram of a plate-shaped or beam-shaped proof mass illustrating various dimensions of the proof mass.

It will be appreciated that reactive-ion etching is independent of crystal orientation, and etch time can be used to control only the depth of an etch, the length and width of the etch being determined independently of the depth. FIG. 25 defines parameters of interest for the following calculations in which the importance of the aspect-ratio (b/a) will become clear.

FIG. 25. Definition of Key Geometrical Parameters

In accordance with an aspect of the invention, high aspect ratio structures are advantageous for several reasons.

As mentioned earlier, the preferred transduction mechanism for an accelerometer is to measure a change in capacitance resulting from the displacement of a mass under acceleration. Most often this is accomplished by having a parallel plate capacitor configuration, such as shown in FIG. 25, in which one plate (beam) moves relative to the other. As the capacitance of such a structure is strongly influenced by the gap (d) between the plates, a measurement of the capacitance provides an accurate measurement of the displacement resulting from acceleration. Clearly an important parameter then is the total capacitance of the device as this will determine the ultimate sensitivity and measurement range available. The capacitance (C) of the structure shown in FIG. 25, per unit of silicon wafer area, is given by:

$$C \approx n\varepsilon \frac{b \cdot L}{d} \cdot \frac{1}{a \cdot L} \approx n\varepsilon \left(\frac{b}{a}\right)\frac{1}{d} \qquad \text{Eq. (1)}$$

where n is the number of plate pairs, and E is the dielectric constant of the material between the plates, typically air ($8.85 \times 10^{-12}$ F/m).

If the device is to be a capacitively driven actuator, then the force generated is a key performance factor. The force per unit area of silicon wafer for a comb-drive geometry actuator is given by:

$$F = n\varepsilon \frac{b \cdot V^2}{d} \cdot \frac{1}{a \cdot L} = n\varepsilon \left(\frac{b}{a}\right)\frac{V^2}{d \cdot L} \qquad \text{Eq. (2)}$$

where V is the voltage applied between the beams.

An additional important performance factor is the stiffness of the mechanical structures as this determines the resonant frequency of the device and its resistance to motion out of the plane. Higher resonant frequencies increase the operating bandwidth of the device, while high out-of-plane stiffness precludes unwanted mechanical modes and transverse response. The stiffness ($K_x$) of a micromechanical beam loaded at its midpoint by a force acting in the x-direction (as defined in FIG. 25__) is given by:

$$K_x = \frac{48 \cdot E \cdot I}{L^3} = \frac{4 \cdot E}{L^3} \cdot a^3 \cdot b \qquad \text{Eq. (3)}$$

where E is the Young's modulus of the material (for single crystal silicon E is $1.9 \times 10^{11}$ N/m) and I is the moment of inertia ($a^3 b/12$).

If the force acts on the top of the beam (in the z-direction), then the "height" and "width" of the beam are reversed in Equation 3 and, therefore, the ratio of stiffness in the z-direction (out-of-plane) to that in the x-direction is given by:

$$\frac{K_z}{K_x} = \left(\frac{b}{a}\right)^2 \qquad \text{Eq. (4)}$$

Equation 4 shows that this ratio increases as the square of the aspect-ratio. Hence, for MEMS devices with an aspect ratio of 20:1 as can be fabricated using reactive-ion etching versus a surface micromachined device with an aspect-ratio of 2:1, the improvement in out-of-plane (or similarly, transverse stiffness, $K_y/K_x$) is a factor of 100.

The calculations presented above for sensing capacitance and actuating force were stated as per unit area of silicon. The relevance of this quantity is that the manufacturing yield of a silicon IC chip in conventional microelectronic device processing is essentially inversely proportional to the area of the chip. The larger the chip size the lower the yield per wafer. Hence, capacitance or force per unit chip area provides a means for comparing surface micromachining with reactive-ion etching for comparable manufacturing yields.

In surface micromachining, the height of the mechanical structures (b) is determined by the thickness of the polycrystalline silicon film deposited. Residual stress in polysilicon films establishes a practical limit of 2–4 μm for their height, whereas, in plasma etching, the height of the structures is determined by the depth of the reactive ion (plasma) etch. In practice these heights can be at least 20 μm. Recent research advances in plasma micromachining suggest the possibility of structures in single crystal silicon as high as 100 μm, that is, 20 to 50 times higher than possible with polysilicon surface micromachining. See U.S. patent application Ser. No. 08/383,524, incorporated herein by reference.

The beam width (a) and separation (d) are determined by the resolution of the lithography utilized in either surface micromachining or reactive-ion etching. Both techniques can attain minimum feature sizes of 1.5 μm and smaller. Hence, one key distinction between conventional surface micromachining and reactive-ion etching is the greater beam height and aspect-ratio attainable through reactive ion etching the latter. A factor of ten higher beam height for reactive-ion etching (e.g. 20 μm versus 2 μm) results in sensing capacitance and actuating force per unit area of silicon at least ten times that available with surface micromachining. Table 2 provides some representative values. The significant advantages of reactive-ion etching are clearly illustrated in the right-hand two columns of the table.

TABLE 2

| | Surface Micromachining | Reactive-ion Etching (using same parameters as surface micromachining other than aspect ratio) | Reactive-ion Etching (using typical process capabilities) |
|---|---|---|---|
| Beam width (a) | 4 μm | 4 μm | 1.5 μm |
| Beam height (b) | 2 μm | 20 μm | 20 μm |
| Beam separation (d) | 1.3 μm | 1.3 μm | 1.0 μm |
| Beam length (L) | 120 μm | 120 μm | 250 μm |
| Number of pairs (n) | 46 | 46 | 100 |
| Actuator voltage (V) | 24 V | 24 V | 24 V |
| Device capacitance (C) | 0.07 pF | 0.74 pF | 4.4 pF |
| Device actuating force (F) | 0.37 μN | 3.6 μN | 10.2 μN |

Table 2 is compiled from Kuehnel and Sherman, "A Surface Micromachined Silicon Accelerometer with On-Chip Detection Circuitry," *Sensors and Actuators* A 45 (1994), pp. 7–16.

The problems inherent in the limited beam height available in surface micromachining, for example as shown in U.S. Pat. No. 5,345,824, are clearly understood from the above calculations. In the '824 patent, the device capacitance available is very small, with the total device being ~0.1 pF [col. 5 line 1–2, 6]. Kuehnel and Sherman note that one-half of the transducer signal is lost because the lowest input capacitance signal conditioning electronics available has ~0.1 pF of stray capacitance, i.e. on the same order as the transducer itself, resulting in a 6 dB (½) reduction in signal strength.

Using reactive-ion etching for a device with the same geometric area as the '824 patent would result in a total capacitance of 0.7 pF (Table 2, second column). Furthermore, if a more optimal geometry were to be used when reactive-ion etching, an accelerometer can be obtained with 4.4 pF of capacitance, that is, 44 times higher than a conventional accelerometer such as taught by the '824 patent. Thus, at least half of the signal strength of the capacitor is lost from a conventional surface-micromachined accelerometer. In contrast, less than 15% of the signal strength of the comparable reactive-ion etched accelerometer of the present invention is lost to parasitic capacitance.

Kuehnel and Sherman also show the limitation of a conventional polysilicon process in terms of beam stiffness. The authors report that the first (lowest frequency) mechanical mode of the accelerometer sense element is out of the plane of the wafer. The second mode is the desired in plane motion. A structure comprising high aspect ratio beams, such as 20:1, which can be achieved using reactive-ion etching of the present invention, would have 100 times greater out-of-plane stiffness than the '824 device (see Equation 4).

Figure 26:
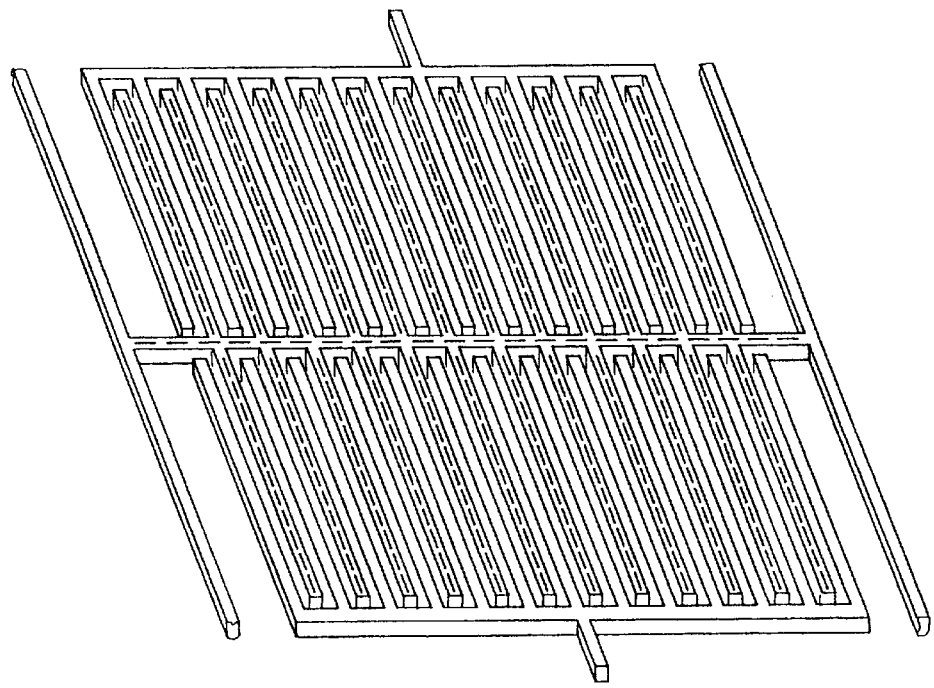
FIG. 26 is an electron micrograph of an accelerometer according to an aspect of the present invention.

In summary, the foregoing aspects of the present invention provide an improved microelectromechanical accelerometer incorporating a sensing element comprising a movable, released structure formed from single crystal silicon with low temperature reactive ion etching. FIG. 26 depicts one embodiment of such an accelerometer. This approach overcomes the shape and height limitations of conventional micromachining processes and achieves a sensing element comprising higher aspect ratio capacitor plates than is possible with a conventional micromachining process. The capacitor plates of the sensing element have greater mechanical stiffness due to the high aspect ratio, particularly if a grid type beam structure is used. This results in greater sensitivity to acceleration vectors within a desired axis of sensitivity. Consequently, this advantageously results in substantial immunity to transverse forces out of the axis of sensitivity. These effects greatly improve the signal-to-noise performance of an accelerometer according to the present invention in contrast to conventional microelectromechanical accelerometers. The foregoing advantages enable an accelerometer of the present invention to be useful in the 0.1 to 1 g range as opposed to the 50 g range ordinarily associated with airbag deployment applications.

A further advantage of fabricating the accelerometer of the present invention from single crystal silicon is that active signal conditioning elements such as transistors can be fabricated directly into the moving silicon beams which act as sensing elements. This substantially eliminates noise due to impedance, parasitic capacitance, as well as mechanical and thermal strains, leading to a much more sensitive detection of motion than is possible with conventional devices.

It will be appreciated that the foregoing features of the invention enable the fabrication of equivalent accelerometers within the scope of the following claims. For example, a plurality of accelerometers shown in the accompanying drawings, including FIG. 26, can be fabricated on a single substrate or from a single silicon wafer. In order to sense acceleration along two orthogonal axes, it is possible to fabricate two accelerometers on the same chip which are aligned perpendicular to each other. However, in such a structure the accelerometers still incorporate the foregoing features of released sensing elements fabricated from a single wafer using a reactive ion etching process.

As previously described, the features of the present invention enable one to predetermine the shape and stiffness of a high aspect ratio released structure used for the sensing element. Therefore, it is also possible to preselect the resonant frequency and the response or sensitivity of the sensing element. As a result, a variety of ranges of sensitivity can be obtained on a single chip by fabricating multiple accelerometers in parallel, each with a different range of sensitivity. Using the foregoing features of the present invention, one could combine a linear and an angular accelerometers on a single chip. Therefore, persons of ordinary skill in this field are to understand that all such equivalent structures are to be included within the scope of the following claims.

While the invention has been described in connection with what are presently considered to be the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A micromechanical automotive suspension system in a vehicle comprising:

an accelerometer for producing a continuous output signal in response to sensed acceleration vectors, said accelerometer including at least two capacitively-coupled fingers, at least one of said fingers moves relative to another finger in response to said acceleration vectors to produce a change in capacitance, wherein at least one of said fingers is characterized by an aspect ratio greater than about 4 to 1, said fingers being fabricated from a single silicon substrate by etching the substrate at least partially by reactive ion etching;

means for applying a potential across adjacent capacitively-coupled fingers to generate said output signal upon a change in the capacitance between said adjacent fingers upon relative motion of said adjacent fingers;

a vehicle suspension; and a suspension positioning unit for receiving the output signal from the accelerometer and for positioning the vehicle suspension in response to said acceleration vectors.

2. The suspension system of claim 1, wherein said accelerometer includes VLSI electronics fabricated on said silicon substrate.

3. The suspension system of claim 1, wherein said accelerometer is a micron-scale micromechanical structure.

4. The suspension system of claim 3, wherein said at least one movable finger is mounted in said substrate and is coplanar with said substrate.

5. The suspension system of claim 4, further including high aspect ratio springs connected between said at least one movable finger and said substrate.

6. The suspension system of claim 5 wherein said at least one movable finger and said springs are fabricated to have an aspect ratio of between about 10:1 and about 20:1 to resist out-of-plane motion.

* * * * *